United States Patent
DeVilliers

(10) Patent No.: US 8,871,646 B2
(45) Date of Patent: Oct. 28, 2014

(54) METHODS OF FORMING A MASKING PATTERN FOR INTEGRATED CIRCUITS

(71) Applicant: Micron Technology, Inc., Boise, ID (US)

(72) Inventor: Anton DeVilliers, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/947,792

(22) Filed: Jul. 22, 2013

(65) Prior Publication Data
US 2013/0309871 A1 Nov. 21, 2013

Related U.S. Application Data

(63) Continuation of application No. 12/546,466, filed on Aug. 24, 2009, now Pat. No. 8,492,282.

(60) Provisional application No. 61/117,526, filed on Nov. 24, 2008.

(51) Int. Cl.

| | |
|---|---|
| *H01L 21/311* | (2006.01) |
| *H01L 27/105* | (2006.01) |
| *H01L 21/3213* | (2006.01) |
| *H01L 21/308* | (2006.01) |
| *H01L 21/768* | (2006.01) |
| *H01L 21/033* | (2006.01) |
| *H01L 21/027* | (2006.01) |
| *H01L 27/10* | (2006.01) |

(52) U.S. Cl.
CPC ...... *H01L 21/31144* (2013.01); *H01L 27/1052* (2013.01); *H01L 21/32139* (2013.01); *H01L 21/3086* (2013.01); *H01L 21/76816* (2013.01); *H01L 21/0337* (2013.01); *H01L 21/0273* (2013.01); *H01L 21/0338* (2013.01); *H01L 27/10* (2013.01); *H01L 21/3088* (2013.01)
USPC .......................................... 438/694; 438/689

(58) Field of Classification Search
USPC ................................................. 438/689, 694
See application file for complete search history.

(56) References Cited

U.S. PATENT DOCUMENTS

| | | | |
|---|---|---|---|
| 4,234,362 A | 11/1980 | Riseman | |
| 4,419,809 A | 12/1983 | Riseman et al. | |

(Continued)

FOREIGN PATENT DOCUMENTS

| | | |
|---|---|---|
| DE | 4236609 | 5/1994 |
| EP | 0 227 303 A2 | 7/1987 |

(Continued)

OTHER PUBLICATIONS

Bergeron, et al., "Resolution Enhancement Techniques for the 90nm Technology Node and Beyond," Future Fab International, Issue 15, Jul. 11, 2003, 4 pages.

(Continued)

*Primary Examiner* — Fernando L Toledo
*Assistant Examiner* — Bryan Junge
(74) *Attorney, Agent, or Firm* — Knobbe, Martens, Olson & Bear LLP

(57) ABSTRACT

In some embodiments, methods for forming a masking pattern for an integrated circuit are disclosed. In one embodiment, mandrels defining a first pattern are formed in a first masking layer over a target layer. A second masking layer is deposited to at least partially fill spaces of the first pattern. Sacrificial structures are formed between the mandrels and the second masking layer. After depositing the second masking layer and forming the sacrificial structures, the sacrificial structures are removed to define gaps between the mandrels and the second masking layer, thereby defining a second pattern. The second pattern includes at least parts of the mandrels and intervening mask features alternating with the mandrels. The second pattern may be transferred into the target layer. In some embodiments, the method allows the formation of features having a high density and a small pitch while also allowing the formation of features having various shapes and sizes.

16 Claims, 32 Drawing Sheets

(56) References Cited

U.S. PATENT DOCUMENTS

| | | |
|---|---|---|
| 4,432,132 A | 2/1984 | Kinsbron et al. |
| 4,502,914 A | 3/1985 | Trumpp et al. |
| 4,508,579 A | 4/1985 | Goth et al. |
| 4,648,937 A | 3/1987 | Ogura et al. |
| 4,716,131 A | 12/1987 | Okazawa et al. |
| 4,776,922 A | 10/1988 | Bhattacharyya et al. |
| 4,803,181 A | 2/1989 | Buchmann et al. |
| 4,838,991 A | 6/1989 | Cote et al. |
| 5,013,680 A | 5/1991 | Lowrey et al. |
| 5,053,105 A | 10/1991 | Fox, III |
| 5,117,027 A | 5/1992 | Bernhardt et al. |
| 5,328,810 A | 7/1994 | Lowrey et al. |
| 5,330,879 A | 7/1994 | Dennison |
| 5,470,661 A | 11/1995 | Bailey et al. |
| 5,514,885 A | 5/1996 | Myrick |
| 5,593,813 A | 1/1997 | Kim |
| 5,670,794 A | 9/1997 | Manning |
| 5,753,546 A | 5/1998 | Koh et al. |
| 5,789,320 A | 8/1998 | Andricacos et al. |
| 5,795,830 A | 8/1998 | Cronin et al. |
| 5,830,332 A | 11/1998 | Babich et al. |
| 5,858,620 A | 1/1999 | Ishibashi et al. |
| 5,895,740 A | 4/1999 | Chien et al. |
| 5,899,746 A | 5/1999 | Mukai |
| 5,998,256 A | 12/1999 | Juengling |
| 6,004,862 A | 12/1999 | Kim et al. |
| 6,010,946 A | 1/2000 | Hisamune et al. |
| 6,020,255 A | 2/2000 | Tsai et al. |
| 6,042,998 A | 3/2000 | Brueck et al. |
| 6,057,573 A | 5/2000 | Kirsch et al. |
| 6,063,688 A | 5/2000 | Doyle et al. |
| 6,071,789 A | 6/2000 | Yang et al. |
| 6,110,837 A | 8/2000 | Linliu et al. |
| 6,143,476 A | 11/2000 | Ye et al. |
| 6,207,490 B1 | 3/2001 | Lee et al. |
| 6,211,044 B1 | 4/2001 | Xiang et al. |
| 6,239,008 B1 | 5/2001 | Yu et al. |
| 6,288,454 B1 | 9/2001 | Allman et al. |
| 6,291,334 B1 | 9/2001 | Somekh |
| 6,297,554 B1 | 10/2001 | Lin |
| 6,335,257 B1 | 1/2002 | Tseng |
| 6,348,380 B1 | 2/2002 | Weimer et al. |
| 6,362,057 B1 | 3/2002 | Taylor, Jr. et al. |
| 6,383,907 B1 | 5/2002 | Hasegawa et al. |
| 6,395,613 B1 | 5/2002 | Juengling |
| 6,423,474 B1 | 7/2002 | Holscher |
| 6,455,372 B1 | 9/2002 | Weimer |
| 6,500,756 B1 | 12/2002 | Bell et al. |
| 6,514,884 B2 | 2/2003 | Maeda |
| 6,522,584 B1 | 2/2003 | Chen et al. |
| 6,534,243 B1 | 3/2003 | Templeton |
| 6,548,396 B2 | 4/2003 | Naik et al. |
| 6,559,017 B1 | 5/2003 | Brown et al. |
| 6,566,280 B1 | 5/2003 | Meagley et al. |
| 6,573,030 B1 | 6/2003 | Fairbairn et al. |
| 6,602,779 B1 | 8/2003 | Li et al. |
| 6,620,715 B1 | 9/2003 | Blosse et al. |
| 6,632,741 B1 | 10/2003 | Clevenger et al. |
| 6,638,441 B2 | 10/2003 | Chang et al. |
| 6,667,237 B1 | 12/2003 | Metzler |
| 6,673,684 B1 | 1/2004 | Huang et al. |
| 6,686,245 B1 | 2/2004 | Mathew et al. |
| 6,689,695 B1 | 2/2004 | Lui et al. |
| 6,706,571 B1 | 3/2004 | Yu et al. |
| 6,709,807 B2 | 3/2004 | Hallock et al. |
| 6,734,107 B2 | 5/2004 | Lai et al. |
| 6,737,214 B2 | 5/2004 | Takeda et al. |
| 6,744,094 B2 | 6/2004 | Forbes |
| 6,762,449 B2 | 7/2004 | Uchiyama et al. |
| 6,773,998 B1 | 8/2004 | Fisher et al. |
| 6,818,141 B1 | 11/2004 | Plat et al. |
| 6,835,662 B1 | 12/2004 | Erhardt et al. |
| 6,867,116 B1 | 3/2005 | Chung |
| 6,875,703 B1 | 4/2005 | Furukawa et al. |
| 6,893,972 B2 | 5/2005 | Rottstegge et al. |
| 6,916,594 B2 | 7/2005 | Bok et al. |
| 6,924,191 B2 | 8/2005 | Liu et al. |
| 6,955,961 B1 | 10/2005 | Chung |
| 6,962,867 B2 | 11/2005 | Jackson et al. |
| 7,015,124 B1 * | 3/2006 | Fisher et al. .................. 438/586 |
| 7,074,668 B1 | 7/2006 | Park et al. |
| 7,084,076 B2 | 8/2006 | Park et al. |
| 7,183,205 B2 | 2/2007 | Hong |
| 7,183,597 B2 | 2/2007 | Doyle |
| 7,202,174 B1 | 4/2007 | Jung et al. |
| 7,208,379 B2 | 4/2007 | Venugopal et al. |
| 7,271,107 B2 | 9/2007 | Marks et al. |
| 7,288,445 B2 | 10/2007 | Bryant et al. |
| 7,291,560 B2 | 11/2007 | Parascandola et al. |
| 7,378,727 B2 | 5/2008 | Caspary et al. |
| 7,442,976 B2 | 10/2008 | Juengling |
| 7,537,866 B2 | 5/2009 | King Liu |
| 7,713,818 B2 | 5/2010 | Chan |
| 7,718,529 B2 | 5/2010 | Deng et al. |
| 7,851,135 B2 | 12/2010 | Jung et al. |
| 8,143,163 B2 * | 3/2012 | Choi ............................ 438/689 |
| 2002/0042198 A1 | 4/2002 | Bjarnason et al. |
| 2002/0045308 A1 | 4/2002 | Juengling |
| 2002/0063110 A1 | 5/2002 | Cantell et al. |
| 2002/0068243 A1 | 6/2002 | Hwang et al. |
| 2002/0094688 A1 | 7/2002 | Mitsuiki |
| 2002/0127810 A1 | 9/2002 | Nakamura |
| 2003/0006410 A1 | 1/2003 | Doyle |
| 2003/0044722 A1 | 3/2003 | Hsu et al. |
| 2003/0109102 A1 | 6/2003 | Kujirai et al. |
| 2003/0119307 A1 | 6/2003 | Bekiaris et al. |
| 2003/0127426 A1 | 7/2003 | Chang et al. |
| 2003/0157436 A1 | 8/2003 | Manger et al. |
| 2003/0207207 A1 | 11/2003 | Li |
| 2003/0207584 A1 | 11/2003 | Sivakumar et al. |
| 2003/0215978 A1 | 11/2003 | Maimon et al. |
| 2003/0216050 A1 | 11/2003 | Golz et al. |
| 2003/0230234 A1 | 12/2003 | Nam et al. |
| 2004/0000534 A1 | 1/2004 | Lipinski |
| 2004/0017989 A1 | 1/2004 | So |
| 2004/0018738 A1 | 1/2004 | Liu |
| 2004/0023475 A1 | 2/2004 | Bonser et al. |
| 2004/0023502 A1 | 2/2004 | Tzou et al. |
| 2004/0043623 A1 | 3/2004 | Liu et al. |
| 2004/0053475 A1 | 3/2004 | Sharma |
| 2004/0079988 A1 | 4/2004 | Harari |
| 2004/0106257 A1 | 6/2004 | Okamura et al. |
| 2004/0235255 A1 | 11/2004 | Tanaka et al. |
| 2005/0074949 A1 | 4/2005 | Jung et al. |
| 2005/0112886 A1 | 5/2005 | Asakawa et al. |
| 2005/0142497 A1 | 6/2005 | Ryou |
| 2005/0153562 A1 | 7/2005 | Furukawa et al. |
| 2005/0167394 A1 | 8/2005 | Liu et al. |
| 2005/0186705 A1 | 8/2005 | Jackson et al. |
| 2005/0272259 A1 | 12/2005 | Hong |
| 2006/0003182 A1 | 1/2006 | Lane et al. |
| 2006/0011947 A1 | 1/2006 | Juengling |
| 2006/0024940 A1 | 2/2006 | Furukawa et al. |
| 2006/0024945 A1 | 2/2006 | Kim et al. |
| 2006/0046161 A1 | 3/2006 | Yin et al. |
| 2006/0046200 A1 | 3/2006 | Abatchev et al. |
| 2006/0046201 A1 | 3/2006 | Sandhu et al. |
| 2006/0046422 A1 | 3/2006 | Tran et al. |
| 2006/0046484 A1 | 3/2006 | Abatchev et al. |
| 2006/0083996 A1 | 4/2006 | Kim |
| 2006/0115978 A1 | 6/2006 | Specht |
| 2006/0172540 A1 | 8/2006 | Marks et al. |
| 2006/0189150 A1 | 8/2006 | Jung |
| 2006/0211260 A1 | 9/2006 | Tran et al. |
| 2006/0216923 A1 | 9/2006 | Tran et al. |
| 2006/0231900 A1 | 10/2006 | Lee et al. |
| 2006/0263699 A1 | 11/2006 | Abatchev et al. |
| 2006/0267075 A1 | 11/2006 | Sandhu et al. |
| 2006/0273456 A1 | 12/2006 | Sant et al. |
| 2006/0281266 A1 | 12/2006 | Wells |
| 2007/0018345 A1 | 1/2007 | Chao |
| 2007/0026672 A1 | 2/2007 | Tang et al. |
| 2007/0045712 A1 | 3/2007 | Haller et al. |
| 2007/0048674 A1 * | 3/2007 | Wells ........................... 430/313 |

(56) References Cited

U.S. PATENT DOCUMENTS

| | | |
|---|---|---|
| 2007/0049011 A1 | 3/2007 | Tran |
| 2007/0049030 A1 | 3/2007 | Sandhu et al. |
| 2007/0049032 A1 | 3/2007 | Abatchev et al. |
| 2007/0049035 A1 | 3/2007 | Tran |
| 2007/0049040 A1 | 3/2007 | Bai et al. |
| 2007/0050748 A1 | 3/2007 | Juengling |
| 2007/0077524 A1 | 4/2007 | Koh et al. |
| 2007/0148968 A1* | 6/2007 | Kwon et al. ............... 438/671 |
| 2007/0158688 A1* | 7/2007 | Caspary et al. ............ 257/208 |
| 2007/0200178 A1 | 8/2007 | Yun et al. |
| 2007/0205438 A1 | 9/2007 | Juengling |
| 2007/0210449 A1 | 9/2007 | Caspary et al. |
| 2007/0215874 A1 | 9/2007 | Furukawa et al. |
| 2007/0215960 A1 | 9/2007 | Zhu et al. |
| 2007/0238308 A1 | 10/2007 | Niroomand et al. |
| 2007/0249170 A1 | 10/2007 | Kewley |
| 2007/0261016 A1 | 11/2007 | Sandhu et al. |
| 2007/0275309 A1 | 11/2007 | Liu |
| 2007/0281219 A1 | 12/2007 | Sandhu |
| 2008/0054350 A1 | 3/2008 | Breitwisch et al. |
| 2008/0057692 A1 | 3/2008 | Wells et al. |
| 2008/0070165 A1 | 3/2008 | Fischer et al. |
| 2008/0085612 A1 | 4/2008 | Smythe |
| 2008/0197495 A1* | 8/2008 | Clevenger et al. ......... 257/741 |
| 2008/0261389 A1* | 10/2008 | Jung ........................... 438/593 |
| 2008/0292991 A1 | 11/2008 | Wallow et al. |
| 2008/0299774 A1 | 12/2008 | Sandhu |
| 2009/0011374 A1 | 1/2009 | Chang et al. |
| 2009/0035665 A1 | 2/2009 | Tran |
| 2009/0053657 A1 | 2/2009 | Hatakeyama et al. |
| 2009/0115064 A1 | 5/2009 | Sandhu et al. |
| 2009/0149026 A1 | 6/2009 | Zhou et al. |
| 2009/0152645 A1 | 6/2009 | Tran |
| 2009/0170330 A1* | 7/2009 | Jung ........................... 438/703 |
| 2009/0239382 A1 | 9/2009 | Zhu |
| 2010/0003797 A1 | 1/2010 | Smith |
| 2010/0055913 A1 | 3/2010 | Zhang |

FOREIGN PATENT DOCUMENTS

| | | |
|---|---|---|
| EP | 0 491 408 A2 | 6/1992 |
| EP | 1 357 433 A2 | 10/2003 |
| JP | 57-048237 | 3/1982 |
| JP | 64-035916 | 2/1989 |
| JP | 05343370 | 12/1993 |
| JP | H8-55908 | 2/1996 |
| JP | H8-55920 | 2/1996 |
| JP | 2000-208434 | 7/2000 |
| JP | 2000-357736 | 12/2000 |
| JP | 2004-080033 | 3/2004 |
| JP | 2004-152784 | 5/2004 |
| JP | 2005-150333 | 6/2005 |
| JP | 2006-351861 | 1/2012 |
| KR | 10-1995-0034748 | 12/1995 |
| KR | 10-0122315 | 9/1997 |
| KR | 1999-0001440 | 1/1999 |
| KR | 1999-027887 | 4/1999 |
| KR | 10-2008-0039006 | 5/2008 |
| KR | 10-2009-0102070 | 9/2009 |
| WO | WO 94/15261 | 7/1994 |
| WO | WO 02/099864 A1 | 12/2002 |
| WO | WO 04/001799 A2 | 12/2003 |
| WO | WO 2004/003977 | 1/2004 |
| WO | WO 2005/034215 A1 | 4/2005 |
| WO | WO 2006/026699 A2 | 3/2006 |

OTHER PUBLICATIONS

Bhave et al. "Developer-soluble Gap fill materials for patterning metal trenches in Via-first Dual Damascene process," preprint of Proceedings of SPIE: Advances in Resist Technology and Processing XXI, vol. 5376, 2004, John L. Sturtevant, editor, 8 pages.

Bruek, "Optical and Interferometric Lithography—Nanotechnology Enablers," 2005, Proceedings of the IEEE, vol. 93, No. 10, pp. 1704-1721.

Cerofolini et al., "Strategies for nanoelectronics", *Microelectronic Engineering*, vol. 81, pp. 405-419.

Choi et al. "Sublithographic nanofabrication technology for nanocatalysts and DNA chips," *J.Vac. Sci. Technol.*, Nov./Dec. 2003; pp. 2951-2955.

Chung et al. "Pattern multiplication method and the uniformity of nanoscale multiple lines," J.Vac.Sci.Technol. B21(4), Jul./Aug. 2003, pp. 1491-1495.

Chung et al. "Nanoscale Multi-Line Patterning Using Sidewall Structure," Jpn., J. App.. Phys. vol. 41 (2002) Pt. 1, No. 6B, pp. 4410-4414.

U.S. Appl. No. 11/543,515, filed Oct. 24, 2006.

Ex parte Cantell, unpublished decision of the Board of Patent Appeals and Interferences, Mar. 4, 2005.

IMEC's (sub-)32nm research platform, "IMEC reduces cost of double patterning lithography," IMEC Newsletter 53, p. 5, Jul. 2008.

IMEC Press Release, "IMEC reports progress in advanced lithography program," available at http://imec.be/wwwinter/mediacenter/en/SemiLitho_2007.shtml, Jul. 28, 2008.

International Search Report and Written Report dated Jun. 10, 2010 in International Application No. PCT/US2009/063650.

Joubert et al. "Nanometer scale linewidth control during etching of polysilicon gates in high-density plasmas," Microelectronic Engineering 69 (2003), pp. 350-357.

Oehrlein et al. "Pattern transfer into low dielectric materials by high-density plasma etching," Solid State Tech., May 2000, 8 pages.

Sheats et al., "Microlithography: Science and Technology," 1998, Marcel Dekkar, Inc., pp. 104-105.

Office Action of Jun. 2, 2008 in U.S. Appl. No. 11/219,067, filed Sep. 1, 2005.

Office Action of Jun. 5, 2008 in U.S. Appl. No. 11/514,117, filed Aug. 30, 2006.

Office Action of Jul. 11, 2008 in U.S. Appl. No. 11/367,020, filed Mar. 2, 2006.

Vogler, D., "Freeze frame: JSR closes in on double-patterning at 22nm" Solid State Technology, Apr. 2008.

Yield Engineering Systems, Inc. "Image Reversal" available at http://yieldengineering.com/default.asp?page-246, Nov. 2008.

* cited by examiner

METHODS OF FORMING A MASKING PATTERN FOR INTEGRATED CIRCUITS

CLAIM FOR PRIORITY

This application is a continuation of U.S. patent application Ser. No. 12/546,466, filed Aug. 24, 2009, entitled METHODS OF FORMING A MASKING PATTERN FOR INTEGRATED CIRCUITS, which claims the priority benefit under 35 U.S.C. §119(e) of Provisional Application Ser. No. 61/117,526, filed Nov. 24, 2008. The full disclosures of the priority application are incorporated herein by reference.

BACKGROUND

1. Field of the Invention

This invention relates generally to integrated circuit fabrication and, more particularly, to masking techniques.

2. Description of the Related Art

As a consequence of many factors, including demand for increased portability, computing power, memory capacity and energy efficiency, integrated circuits are continuously being made more dense. The sizes of the constituent features that form the integrated circuits, e.g., electrical devices and interconnect lines, are constantly being decreased to facilitate this scaling.

The trend of decreasing feature size is evident, for example, in memory circuits or devices such as dynamic random access memories (DRAMs), flash memory, static random access memories (SRAMs), ferroelectric (FE) memories, etc. To take one example, DRAM typically comprises millions of identical circuit elements, known as memory cells. In general, a capacitor-based memory cell, such as in conventional DRAM, typically consists of two electrical devices: a storage capacitor and an access field effect transistor. Each memory cell is an addressable location that can store one bit (binary digit) of data. A bit can be written to a cell through the transistor and can be read by sensing charge in the capacitor. Some memory technologies employ elements that can act as both a storage device and a switch (e.g., dendritic memory employing silver-doped chalcogenide glass) and some nonvolatile memories do not require switches for each cell (e.g., magnetoresistive RAM). In addition, in some technologies, some elements can act as both charge storage and charge sensing devices. For example, this is the case with flash memory, thus, allowing this type of memory to have one of the smallest cell sizes ($4F^2$) of all memory technologies. In general, by decreasing the sizes of the electrical devices that constitute a memory cell and the sizes of the conducting lines that access the memory cells, the memory devices can be made smaller. Additionally, storage capacities can be increased by fitting more memory cells on a given area in the memory devices.

The continual reduction in feature sizes places ever greater demands on the techniques used to form the features. For example, photolithography is commonly used to pattern features, such as conductive lines. The concept of pitch can be used to describe the sizes of these features. Pitch is defined as the distance between an identical point in two neighboring features when the pattern includes repeating features, as in arrays. These features are typically defined by spaces between adjacent features, which spaces are typically filled by a material, such as an insulator. As a result, pitch can be viewed as the sum of the width of a feature and of the width of the space on one side of the feature separating that feature from a neighboring feature. However, due to factors such as optics and light or radiation wavelength, photolithography techniques each have a minimum pitch below which a particular photolithographic technique cannot reliably form features. Thus, the minimum pitch of a photolithographic technique is an obstacle to continued feature size reduction.

"Pitch doubling" or "pitch multiplication" is one method for extending the capabilities of photolithographic techniques beyond their minimum pitch. A pitch multiplication method is illustrated in FIGS. 1A-1F and described in U.S. Pat. No. 5,328,810, issued to Lowrey et al., the entire disclosure of which is incorporated herein by reference. With reference to FIG. 1A, a pattern of lines 10 is photolithographically formed in a photoresist layer, which overlies a layer 20 of an expendable material, which in turn overlies a substrate 30. As shown in FIG. 1B, the pattern is then transferred using an etch (for example, an anisotropic etch) to the layer 20, thereby forming placeholders, or mandrels, 40. The photoresist lines 10 can be stripped and the mandrels 40 can be isotropically etched to increase the distance between neighboring mandrels 40, as shown in FIG. 1C. A layer 50 of spacer material is subsequently deposited over the mandrels 40, as shown in FIG. 1D. Spacers 60, i.e., the material extending or originally formed extending from sidewalls of another material, are then formed on the sides of the mandrels 40. The spacer formation is accomplished by preferentially etching the spacer material from the horizontal surfaces 70 and 80 in a directional spacer etch, as shown in FIG. 1E. The remaining mandrels 40 are then removed, leaving behind only the spacers 60, which together act as a mask for patterning, as shown in FIG. 1F. Thus, where a given pitch previously included a pattern defining one feature and one space, the same width now includes two features and two spaces, with the spaces defined by, e.g., the spacers 60. As a result, the smallest feature size possible with a photolithographic technique is effectively decreased.

While the pitch is actually halved in the example above, this reduction in pitch is conventionally referred to as pitch "doubling," or, more generally, pitch "multiplication." Thus, conventionally, "multiplication" of pitch by a certain factor actually involves reducing the pitch by that factor. The conventional terminology is retained herein.

Because a spacer pattern typically follows the outlines of mandrels, pitch multiplication is generally useful for forming regularly spaced linear features, such as conductive interconnect lines in a memory array. However, in addition to features which extend linearly over relatively large distances (e.g., conductive interconnect lines), integrated circuits typically contain features having various shapes and sizes which can be difficult to form by conventional pitch multiplication processes. In addition, the continuing reduction in the sizes of integrated circuits has provided a continuing demand for reductions in the sizes of features.

Accordingly, there is a continuing need for methods of forming features having a small pitch and high density.

BRIEF DESCRIPTION OF THE DRAWINGS

The invention will be better understood from the Detailed Description of the Preferred Embodiments and from the appended drawings, which are meant to illustrate and not to limit certain embodiments of the invention, and wherein:

FIGS. 10A-12B are schematic, top plan views and cross-sectional views showing a process sequence for forming three dimensional features in a target layer, in accordance with some embodiments, wherein FIGS. 10A, 11A, and 12A are schematic, top plan views; FIG. 12B is a cross-sectional view of FIG. 12A, taken along the line 12B-12B;

FIGS. 13A-15B are schematic, top plan views and cross-sectional views showing a process sequence for forming three dimensional features in a target layer, in accordance with some embodiments, wherein FIGS. 13A and 14A are schematic, top plan views; FIGS. 15A and 15B are cross-sectional views of FIG. 14A, taken along the lines 14B-14B and 14C-14C, respectively, after a pattern of features has been transferred into the target layer;

DETAILED DESCRIPTION

Figure 1A:
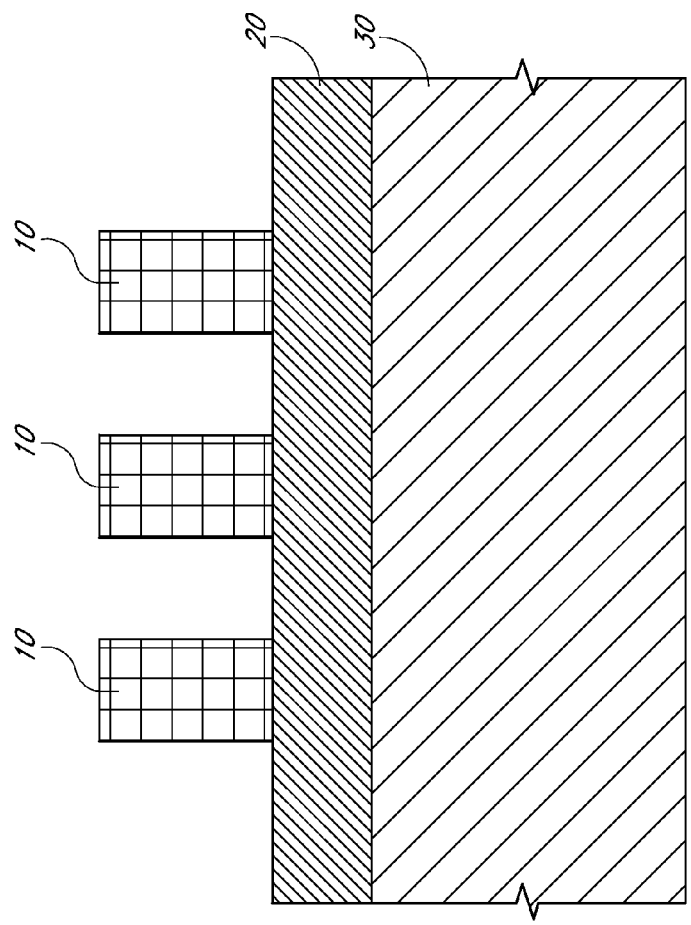
FIGS. 1A-1F are schematic, cross-sectional side views showing a sequence of masking patterns for forming conductive lines, in accordance with a prior art pitch doubling method.
Figure 1B:
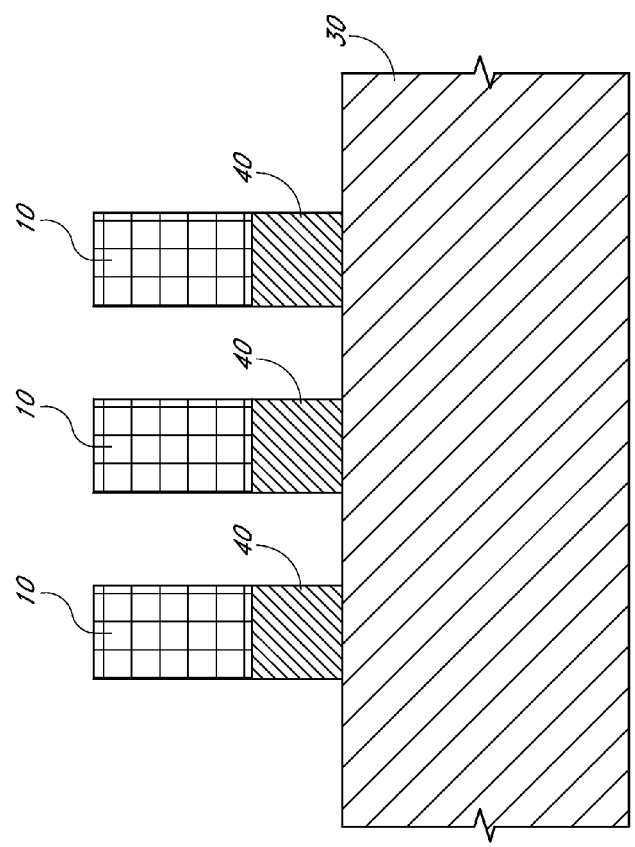
Figure 1C:
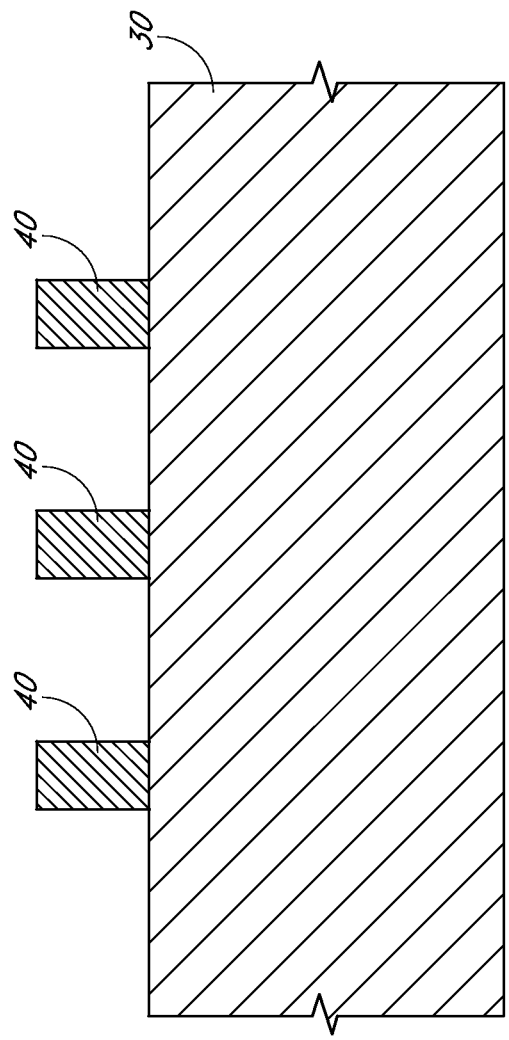
Figure 1D:
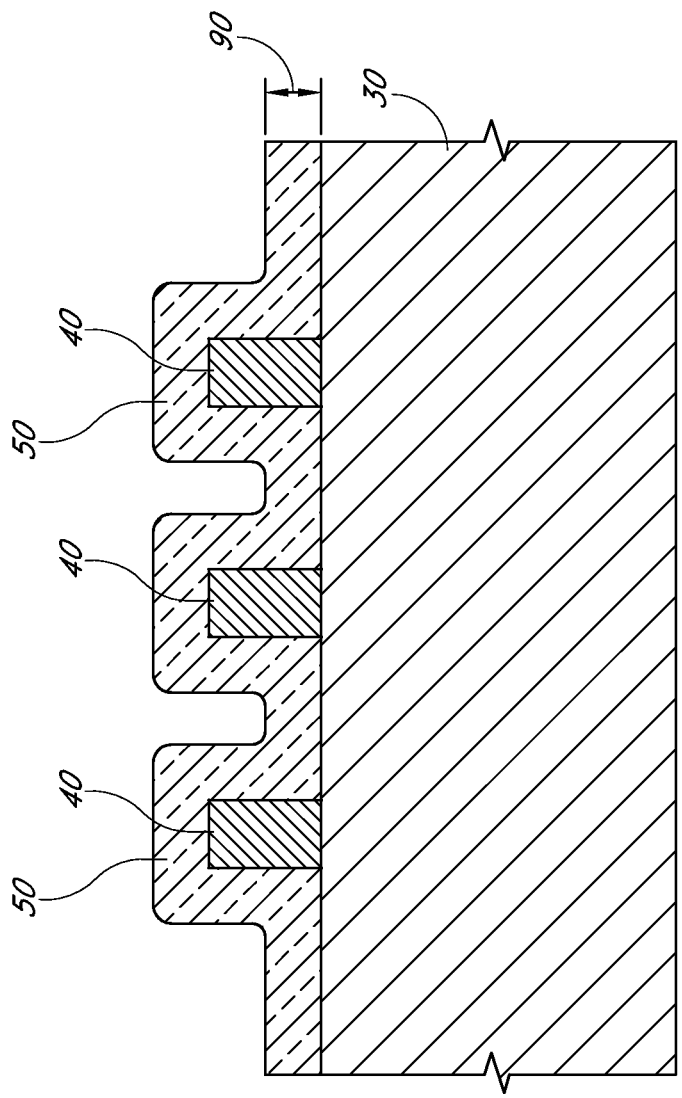
Figure 1E:
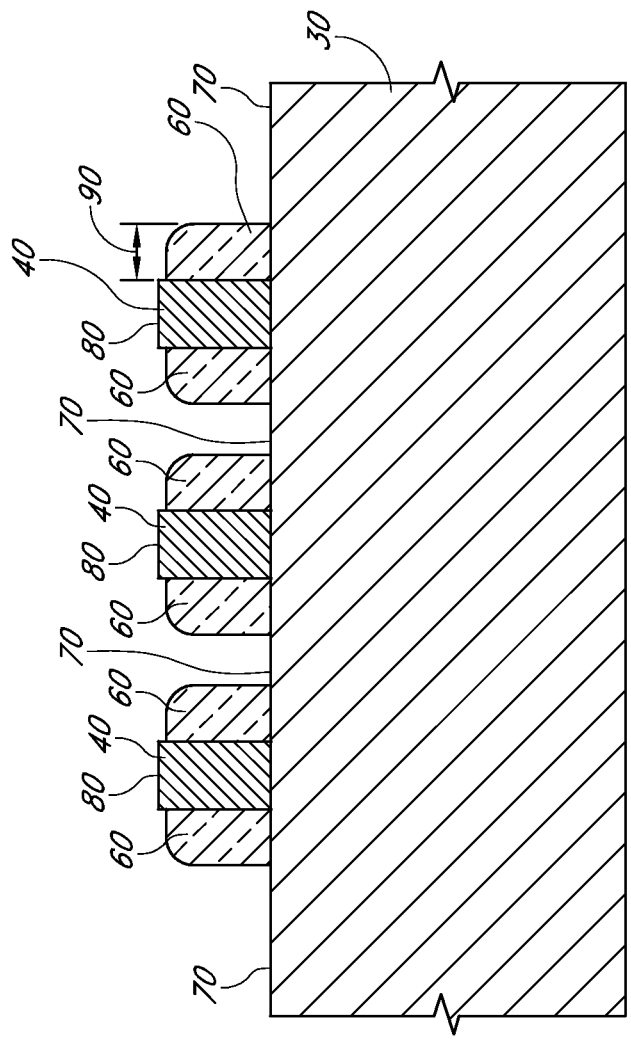
Figure 1F:
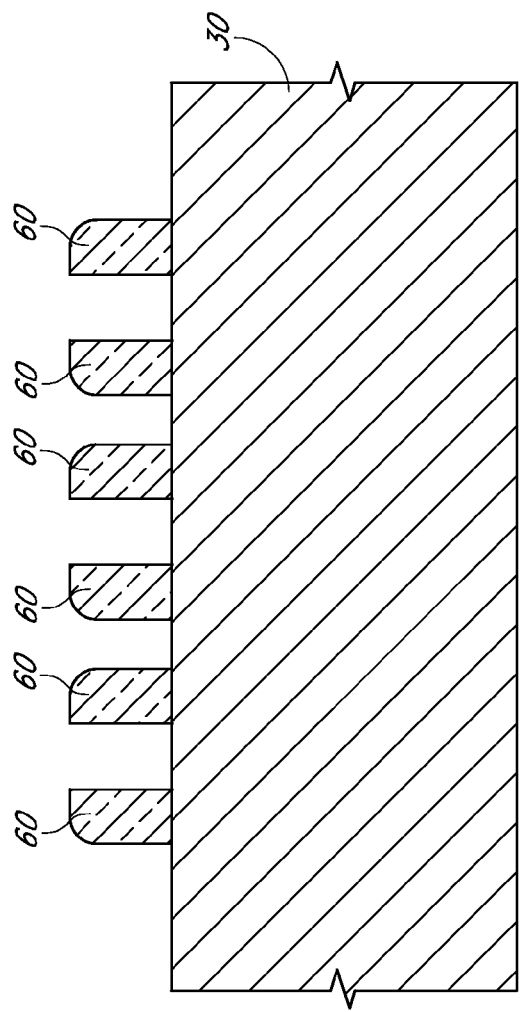

In the context of this document, the term "integrated circuit (IC) device" refers to a semiconductor device, including, but not limited to, a memory device and a microprocessor. The memory device may be a volatile memory such as a random access memory (RAM) or non-volatile memory such as a read-only memory (ROM). Examples of RAMs include dynamic random access memories (DRAMs) and static random access memories (SRAMs). Examples of ROMs include programmable read-only memories (PROMs), erasable programmable read-only memories (EPROMs), electrically-erasable programmable read-only memories (EEPROMs), and flash memories.

The term "semiconductor substrate" is defined to mean any construction comprising semiconductor materials, including, but not limited to, bulk semiconductor materials such as a semiconductor wafer (either alone or in integrated assemblies comprising other materials thereon) and semiconductor material layers (either alone or in integrated assemblies comprising other materials). The term "substrate" refers to any supporting substrate, including, but not limited to, the semiconductor substrates described above. Also in the context of this document, the term "layer" encompasses both the singular and the plural unless otherwise indicated. A layer may overlie a portion of, or the entirety of, a substrate.

The term, "features," as used herein, refers to parts of a pattern, such as lines, spaces, via, pillars, trenches, troughs, or moats. The term, "mandrels," as used herein, refers to mask features formed at a vertical level. The term, "intervening mask features, as used herein, refers to mask features that are formed between two immediately neighboring mandrels.

The term "array" refers to a regularly repeating pattern of IC elements on a semiconductor substrate. For example, a memory array typically has a number of identical memory cells in a matrix form. Logic arrays may similarly include repeating patterns of conductive lines and/or transistors.

The term, "target layer," as used herein, refers to a layer in which a pattern of features is formed. A target layer may be part of a semiconductor substrate. A target layer may include metal, semiconductor, and/or insulator.

It will also be appreciated that transferring a pattern from a first (e.g., masking) level to a second level involves forming features in the second level that generally correspond to features on the first level. For example, the path of lines in the second level will generally follow the path of lines on the first level. The location of other features on the second level will correspond to the location of similar features on the first level. The precise shapes and sizes of corresponding features can vary from the first level to the second level, however due, for example, to trim and growth steps. As another example, depending upon etch chemistries and conditions, the sizes of and relative spacings between the features forming the transferred pattern can be enlarged or diminished relative to the pattern on the first level, while still resembling the same initial "pattern."

While "processing" through masks is described for some embodiments as etching to transfer a hard mask pattern into a target layer, the skilled artisan will appreciate that processing in other embodiments can comprise, e.g., oxidation, nitridation, selective deposition, doping, etc. through the masks.

In some embodiments, methods are provided for forming a masking pattern for an electronic device, such as an integrated circuit. First, mandrels defining a first pattern are formed in a first masking layer provided over a target layer. As nonlimiting examples, the mandrels may be formed of a resist, a hard mask material, or part of a substrate. A second masking layer is deposited in spaces between the mandrels. The second masking layer at least partly fills the spaces between the mandrels. In some embodiments, the second masking layer may bury the first pattern.

Before or after depositing the second masking layer, one or more sacrificial structures are formed to define a second pattern having a smaller pitch than the first pattern. In some embodiments, the one or more sacrificial structures may be formed by altering, e.g., chemically altering, portions of either or both of the mandrels and the second masking layer. In other embodiments, the one or more sacrificial structures may be formed by growing or depositing a layer of a material that is different, or selectively etchable relative to, those of the first and second masking layers before depositing the second masking layer. The resulting intermediate masking structures according to some embodiments are shown in FIGS. 2A and 2B.

Figure 2A:
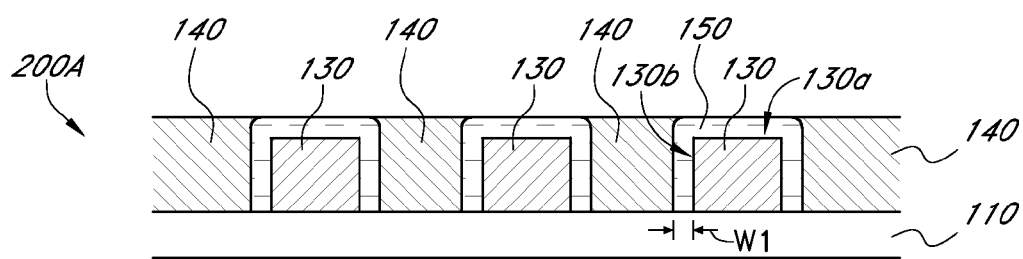
FIGS. 2A and 2B are schematic, cross-sectional views showing intermediate masking structures, in accordance with some embodiments.

In FIG. 2A, an intermediate masking structure 200A includes mandrels 130, a second masking layer 140, and sacrificial structures 150 that are formed on a target layer 110. The mandrels 130 are spaced apart. The sacrificial structures 150 are formed on top and side surfaces 130a, 130b of the mandrels 130. The second masking layer 140 fills the remainder of the spaces between the mandrels 130.

Figure 2B:
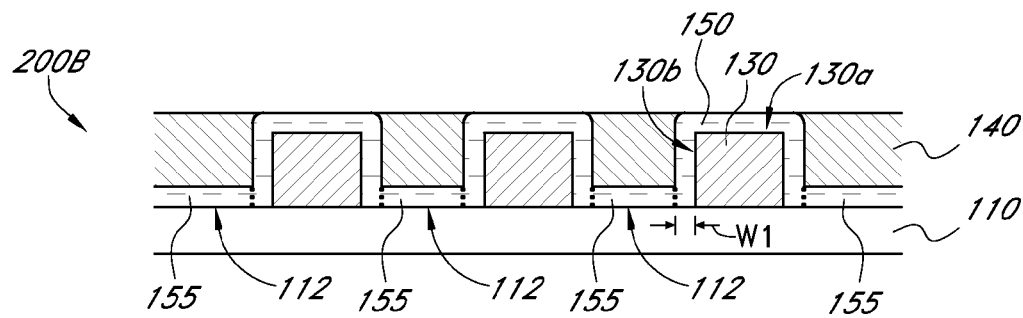

Referring to FIG. 2B, another intermediate masking structure 200B includes mandrels 130, a second masking layer 140, sacrificial structures 150, and partial gap fillers 155 formed on a target layer 110. The mandrels 130 are spaced apart from one another on the target layer 110. The sacrificial structures 150 are conformally formed on top and side surfaces 130a, 130b of the mandrels 130. The partial gap fillers 155 are formed of the same material as the material of the sacrificial structures. The partial gap fillers 155 are formed on top surfaces 112 of the target layer 110 between the mandrels 130 covered with the sacrificial structures 150. In some embodiments, the partial gap fillers 155 may be formed simultaneously with the sacrificial structures 150. The second masking layer 140 fills the remaining spaces between the mandrels 130.

The sacrificial structures 150 are removed to create gaps between the mandrels 130 and the second masking layer 140. Such sacrificial structures are referred to as "anti-spacers" in the context of this document. The resulting masking structure may include the mandrels 130 and intervening mask features formed of the second masking layer 140 (FIG. 2A). Alternatively, the resulting masking structure may include the mandrels 130 and intervening mask features including the second masking layer 140 and the partial gap fillers (FIG. 2B). In some embodiments, the mandrels 130 and the intervening mask features alternate with each other, and together define a second pattern.

In some embodiments, the mandrels in the second pattern have a first pitch between two adjacent mandrels. The intervening mask features in the second pattern have a pitch substantially the same as the first pitch. The mandrels and intervening mask features are both used as masking features for the second pattern. The second pattern has a second pitch defined by the mandrels and an immediately adjacent one of the intervening mask features. The second pitch is about a half of the first pitch. Thus, the foregoing process and features provide pitch doubling, that is, the second pattern has a pitch that is half of the pitch of the first pattern. In other embodiments, the pitch of the second pattern may be further reduced by performing an additional process employing anti-spacers as described herein, or by blanket depositing and etching spacer material to form spacers on sidewalls of the mandrels and intervening mask features.

The methods described herein can be used for forming three dimensional structures in a target layer. The three dimensional structures include, but are not limited to, lines, trenches, vias, posts, pillars, troughs, moats, and two or more of the foregoing. In addition, the methods can form structures having different sizes and shapes, for example, variable width conductive lines and landing pads.

The methods discussed above and described below in the context of certain embodiments allow decreases in pitch and increases in the density of features. In addition, the methods allow forming features having various shapes and sizes with a low number of patterning steps.

With reference again to FIGS. 2A and 2B, various processes can be adapted for forming the mandrels 130, the second masking layer 140, the sacrificial structures 150, and/or partial gap fillers 155. Examples of such processes include, but are not limited to, those listed in Table 1.

TABLE 1

| Processes | | |
|---|---|---|
| Lithography (LG) | Furnace (FF) | UV cure (UVC) |
| Single layer etch (SLE) | Chemical vapor deposition (CVD) | UV bake (UVB) |
| Multi layer etch (MLE) | Physical vapor deposition (PVD) | Vacuum bake (VB) |
| Diffusion limited shrink (DLS) | Spin-on deposition (SO) | Plating process (PU) |
| Diffusion limited growth (DLG) | Wet development (WD) | Hard mask formation (HM) |
| Thermal freeze (TF) | Solvent development (SD) | Chemical shrink (CS) |
| Plasma freeze (PF) | Dry development (DD) | Plasma shrink (PS) |
| Vapor freeze (VF) | Plasma etch (PE) | Crosslinking (CL) |
| Chemical freeze (CF) | Plasma descum (PD) | Chemical growth (CG) |
| Exposure freeze (EF) | Chemical descum (CD) | Plasma growth (PG) |
| Thermal reflow (TR) | Slim process (SL) | Vapor treatment (VT) |
| Chemical reflow (CR) | Image reversal (IR) | Silation process (SP) |
| Atomic layer deposition (ALD) | Overcoating (OC) | Reactive ion etch (RIE) |
| Plasma deposition (PD) | Anti-spacer formation (AS) | Phase change (PC) |
| Deprotection process (DPP) | Selectivity change (SEC) | Solubility change (SC) |

The processes and materials of Tables 1 and 2 will be understood by those of skill in the art, particularly in view of the present disclosure. In Table 1, the term "single level etch" refers to a process in which a single layer is provided and etched to form features of a pattern. The term "multi level etch" refers to a process in which multiple layers are provided and etched to form features of a pattern. The term "diffusion limited shrink" refers to a process in which a solubility change in a feature is caused by a coat, thereby allowing a decrease in a dimension of the feature. The term "diffusion limited growth" refers to a process in which a material is chemically attached to a pre-existing feature, e.g., through a reaction or adsorption, thereby increasing the dimension of the feature.

The term "freeze" refers to a surface treatment that protects a pattern by maintaining the integrity of the boundaries of the features forming the pattern; for example, freezing a pattern formed by a photoresist to prevent it from dissolving into an overlying photoresist layer. In some instances, a "freeze" process can be performed to change the chemical solubility of a material that is being "frozen." After the freeze process, the frozen material no longer exhibits solubility to solvents which would otherwise dissolve the material before the freeze process. For example, a photoresist, after being subjected to a freeze process, would be insoluble to solvents, such as propylene glycol monomethyl ether acetate (PGMEA) or ethyl lactate.

The term "reflow" refers to a process inducing a feature size change, a line increase, and a space decrease, for example, a thermal process that is designed for such a feature size shift to occur. The term "deprotection process" refers to a process in which a feature protected from a chemical reaction or dissolution by a solvent is released and allowed to become reactive or soluble. The term "furnace" refers to a process that includes a thermal bake at a temperature ranging typically, but not limited to, from about 250° C. to about 1000° C. The term "solvent development" refers to a process in which an unconventional solvent-based developer (e.g., a solvent other than tetramethylammonium hydroxide (TMAH)) is used to define a pattern.

The term "descum" refers to a process for removing small portions or residues of a material. The term "slim process" refers to a process that induces a feature size change, namely, a size decrease and a space increase. The term "overcoating" refers to a process of depositing or spinning-on a layer over an existing layer. The term "anti-spacer formation" refers to a process of forming anti-spacers, as described herein. The term "selectivity change" refers to an etch process having the ability to differentiate the etch rate of a target material from the etch rate of a non-target material. The term "plating process" refers to an electrochemical process of depositing a metal on an existing layer(s). The term "shrink" refers to a process for reducing a size of a feature. The term "plasma growth" refers to a process designed to add additional material to an existing feature, with assistance of a plasma operation. The term "vapor treatment" refers to a process in which a gas phase material is used to interact with a substrate. The term "silation process" refers to a process of forming a silane compound. The term "phase change" refers to a process in which a substrate undergoes a phase change during the process. The term "solubility change" refers to a process that changes the solubility of a material in a specific solution.

The mandrels 130, the second masking layer 140, the sacrificial structures 150, and/or partial gap fillers 155 may be formed of various materials. Examples of such materials include, but are not limited to, those listed in Table 2.

TABLE 2

| Materials | |
|---|---|
| oxide (OX) | Spin on glass (SOG) |
| nitride (N) | Tetraethylorthosilicate (TEOS) |
| silicon oxide (SiO) | Metal-containing hard mask (MHM) |
| Silicon hard mask (SHM) | Image reversal film (IRF) |
| Titanium polymer (TP) | tetramethylammonium hydroxide (THAM) developer (TD) |
| Silicon polymer (SP) | Solvent developer (SD) |
| Deposited ARC - SiOxN (DARC) | Gas (GAS) |
| Bottom Antireflective Coating (BARC) | Hexamethyldisilazane (HMDS) |
| Specific development chemistry (SDS) | Diethylaminotrimethlysilane (DEATS) |
| Photoresist (PR) | Spin on overcoat (SOO) |
| Deposited underlayer (DUL) | Deposited overcoat (DO) |
| Spin on underlayer (SUL) | Vapor freeze chemistry (VFC) |
| Reactivity promoter (RP) | Solvent suspensions (PGMEA or other) |

In Table 2, the term "specific development chemistry" refers to a chemical or material, such as butyl acetate or other customized solvents for development. The term "underlayer" refers to a layer of material used for a pattern transfer into an underlying layer. The term "reactivity promoter" refers to a chemical agent that promotes the growth of an organic material on a feature. A reactivity promoter may or may not act as a catalyst to a reaction which it promotes. A reactivity promoter may contribute to the attachment of one material to the surface of another material. Thus, it will be appreciated that the various materials of Table 2 may be formed by one or more of the processes of Table 1. Advantageously, the materials can be combined together and possibly with other materials to form masks for defining patterns. This list is for illustrative purposes only, such that the application of the processes noted herein to some embodiments of the invention may be expressed. The list is not intended to be exhaustive, and as such materials and techniques used in the anti-spacer formation are not limited to this list.

For example, in certain embodiments, a method is provided for forming a masking pattern for an electronic device, such as an integrated circuit. First, mandrels defining a first pattern are formed in a first masking layer deposited over a target layer. As nonlimiting examples, the mandrels may be formed of a resist or a hard mask material. A second masking layer is deposited on and over the first masking layer to at least partly bury the first pattern while maintaining the first pattern. The first pattern may be maintained by subjecting the first pattern to a surface treatment using, for example, a so-called freeze technique, prior to depositing the second masking layer.

Portions of the second masking layer proximate to the mandrels are chemically altered such that the portions are more chemically removable (have higher etchability) than unaltered parts of the second masking layer. The chemically altered portions are immediately adjacent the mandrels and have a selected width, and can be referred to as "anti-spacers" in the context of this document. In some embodiments, the chemical alteration can be achieved by a bake that drives an acid- or base-initiated reaction using an acid or base diffused from the mandrels. The anti-spacers may not expand into the mandrels in this embodiment.

In some other embodiments, both portions of the mandrels immediately adjacent to the second masking layer and portions of the second masking layer immediately adjacent to the mandrels may be chemically altered. In such embodiments, the altered portions of both the mandrels and the second masking layer form anti-spacers. In yet other embodiments, portions of the mandrels immediately adjacent to the second masking layer may be chemically altered while substantially no portion of the second masking layer is chemically altered, thereby forming anti-spacers only in the altered portions of the mandrels.

The chemically altered portions are removed, exposing the mandrels. In certain embodiments, an additional step(s) can be performed to remove any material over the chemically altered portions to expose top surfaces of the chemically altered portions before removing the chemically altered portions. The remainder of the second masking layer forms intervening mask features. The mandrels and the intervening mask features together define a second pattern. The second pattern is transferred into the target layer.

Reference will now be made to the Figures, in which like numerals refer to like parts throughout.

Figure 3A:
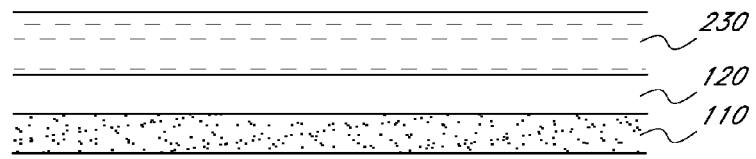
FIGS. 3A-3K are schematic, cross-sectional views showing a process sequence for forming features in a target layer, in accordance with some embodiments.

FIGS. 3A-3K illustrate a method of forming a masking pattern using anti-spacers in accordance with some embodiments. Referring to FIG. 3A, a hard mask layer 120 is provided over a target layer 110. In addition, a first resist layer 230 is provided over the hard mask layer 120.

The target layer 110 may be a layer in which various IC components, parts, and structures are to be formed through IC fabrication processes. Examples of the components, parts, and structures include transistors, capacitors, resistors, diodes, conductive lines, electrodes, spacers, trenches, etc. The identity of the target layer material depends on the type of device to be formed in the target layer 110. Examples of target layer materials include, but are not limited to, insulators, semiconductors, and metals. The target layer 110 may be formed over a substrate, for example, a semiconductor substrate in certain embodiments. In certain other embodiments, at least a portion of a semiconductor substrate forms the target layer 110.

The hard mask layer 120 is a layer that provides a pattern to be transferred into the target layer 110. As described herein, the hard mask layer 120 is patterned to form an array of features that serve as a mask for the target layer 110, e.g., in an etch step. While illustrated with one hard mask layer, the processes described herein can employ two or more hard mask layers. In certain embodiments, the hard mask layer 120 may be omitted.

In some embodiments, the hard mask layer 120 may be formed of an inorganic material. In the illustrated embodiment, the hard mask layer 120 is formed of a dielectric anti-reflective coating (DARC), for example, silicon-rich silicon oxynitride ($SiO_xN_y$). The DARC layer may contain silicon in an amount from about 30 wt % to about 80 wt % with reference to the total weight of the layer. The DARC layer may contain silicon in an amount from 35 wt % to about 70 wt % with reference to the total weight of the layer. In other embodiments, the hard mask layer 120 may be formed of silicon, silicon oxide ($SiO_2$) or silicon nitride ($Si_3N_4$). In yet other embodiments, the hard mask layer 120 may be formed of an organic material. For example, the hard mask layer 120 may be formed of amorphous carbon. The skilled artisan will appreciate that various other hard mask materials can be used for the hard mask layer 120. In some embodiments, the hard mask layer 120 may have a thickness of between about 80 nm and about 800 nm, optionally between about 1 µm and about 3 µm.

The first resist layer 230 may be formed of a first resist material. The first resist material is selected based on the type of lithography used for patterning the first resist layer 230. Examples of such lithography include, but are not limited to, ultraviolet (UV) lithography, extreme ultraviolet (EUV) lithography, X-ray lithography and imprint contact lithography. In the illustrated embodiment, the first resist material is a photoresist, such as a positive resist. The skilled artisan will, however, appreciate that the material of the first resist layer 230 may be varied depending on lithography, availability of selective etch chemistries and IC design.

Optionally, a bottom anti-reflective coating (BARC) layer (not shown) may be provided between the first resist layer 230 and the hard mask layer 120. BARCs, which are typically organic, enhance resolution by preventing reflections of the ultraviolet (UV) radiation that activates the photoresist. BARCs are widely available, and are usually selected based upon the selection of the resist material and the UV wavelength. BARCs, which are typically polymer-based, are usually removed along with the overlying photoresist. The optional BARC layer may have a thickness of between about 200 Å and about 600 Å, optionally between about 300 Å and about 500 Å.

Figure 3B:
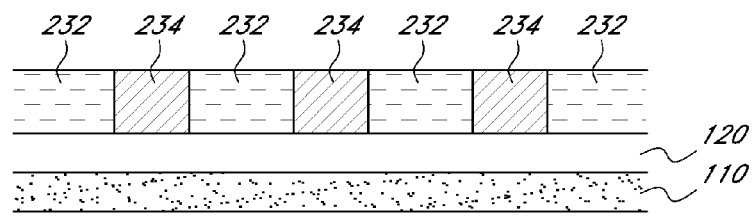

Referring to FIG. 3B, the first resist layer 230 is exposed to a pattern of light directed through a photomask over the first resist layer 230. In the illustrated embodiment, the first resist layer 230 is formed of a positive photoresist. Exposed portions 232 of the first resist layer 230 become soluble in a developer while unexposed portions 234 of the first resist layer 230 remain insoluble in the developer. In other embodiments, the first resist layer 230 may be formed of a negative photoresist. In such embodiments, exposed portions 234 of the first resist layer 230 become insoluble in a developer while unexposed portions 232 of the first resist layer 230 remain soluble in the developer.

After the exposure to the pattern of light, the first resist layer 230 is subjected to development using any suitable developer. Examples of developers include, but are not limited to, sodium hydroxide and tetramethylammonium hydroxide (TMAH). In certain embodiments, rinsing solutions (e.g., propylene glycol monomethyl ether acetate (PG-MEA) and/or propylene glycol monomethyl ether (PGME)) can also be used for the development. In certain embodiments, a post-exposure bake (PEB) may be performed after the exposure and before the development. In the illustrated embodiment, the exposed portions 232 of the first resist layer 230 are removed by the development.

Figure 3C:
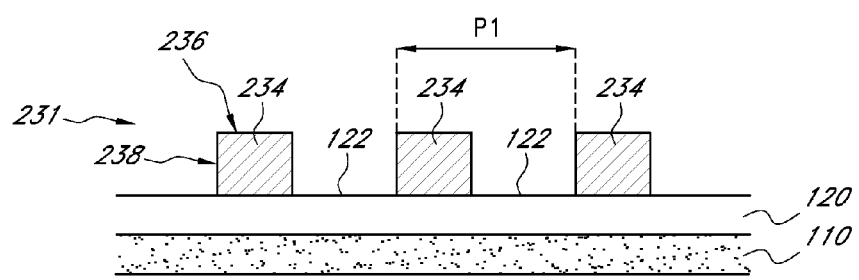

Referring to FIG. 3C, the remaining unexposed portions 234 of the first resist layer 230 form mandrels 234. The mandrels 234 provide a first pattern 231 while exposing surfaces 122 of the hard mask layer 120. The first pattern 231 has a first pitch P1 between two neighboring mandrels 234, as shown in FIG. 3B. Each of the mandrels 234 has a top surface 236 and a side surface 238. The illustrated mandrels 234 have a substantially rectangular or square cross-section. The skilled artisan will, however, appreciate that the cross-sectional shape of the mandrels 234 can be different from that illustrated. For example, the cross-sectional slope can be rounded.

Figure 3D:
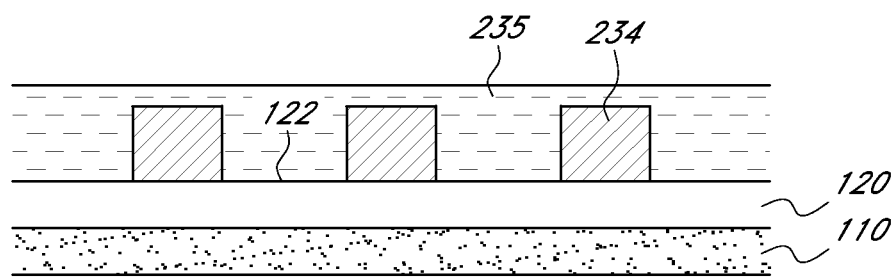

Referring to FIG. 3D, a chemically active species, for example, an acid solution, is deposited over the structure shown in FIG. 3C. In one embodiment, the acid solution can be a spin-on coating that covers the mandrels 234 and the exposed portions 122 of the hard mask layer 120. The acid solution can include an acid such as a conventional photo resist PAG or other organic acid. Subsequently, a bake process is conducted to thermally diffuse the acid into at least portions of the features 234 that are proximate to the top and side surfaces 236, 238 thereof. In some embodiments, the acid may coat the top and side surfaces 236, 238 of the features 234 without being diffused into the features 234. In other embodiments where the features 234 are formed of a material containing a selected amount of acid, this step may be omitted. In certain embodiments, a base solution may be deposited over the structure in place of the acid solution.

Figure 3E:
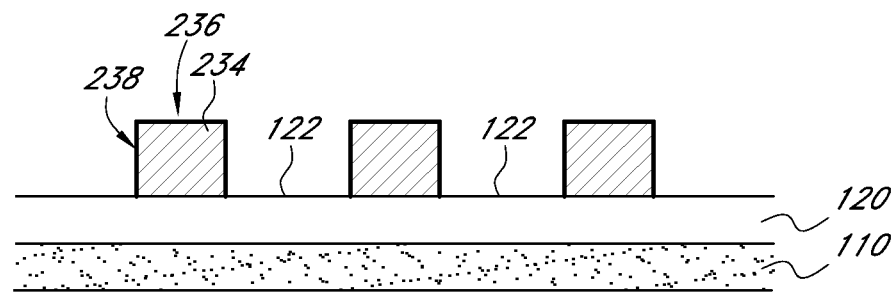

Referring to FIG. 3E, the mandrels 234 may be subjected to a surface treatment. The surfaces 236, 238 of the mandrels 234 are modified such that the integrity of the mandrels 234 is maintained while a second resist layer is formed and patterned thereon. The surface treatment may form a barrier coat or protective layer 236 on the surfaces 236, 238 of the mandrels 234. Such a surface treatment can be referred to as "freeze" in the context of this document. The surface treatment may or may not change the lateral dimensions of the mandrels 234, and may or may not change the spacings between adjacent mandrels 234.

The mandrels 234 can be frozen by various freeze techniques. In one embodiment, the mandrels 234 can be frozen by chemical freeze, using a commercially available fluid overcoat. An example of a chemical freeze technique is disclosed by JSR corporation of Tokyo, Japan in their present product line.

In another embodiment, the mandrels 234 can be frozen by a plasma freeze. A plasma freeze can be conducted, using a plasma directed to the mandrels 234. Examples of plasmas include a fluorine-containing plasma generated from, e.g., a fluorocarbon (e.g., $CF_4$, $C_4F_6$, and/or $C_4F_8$), a hydrofluorocarbon (e.g., $CH_2F_2$, and/or $CHF_3$), or $NF_3$. An example plasma freeze technique is disclosed by U.S. patent application Ser. No. 12/201,744, filed Aug. 29, 2008, entitled "METHODS OF FORMING A PHOTORESIST-COMPRISING PATTEN ON A SUBSTRATE" (Inventors: Zhang et al.). In yet another embodiment, the mandrels 234 can be frozen by a thermal freeze. The thermal freeze can be conducted at a temperature between about 110° C. and about 180° C. An example of a thermal freeze technique is disclosed by Tokyo Ohka Kogyo Co., Ltd. of Kawasaki-shi, Kanagawa Prefecture, Japan in their commercially available products.

Figure 3F:
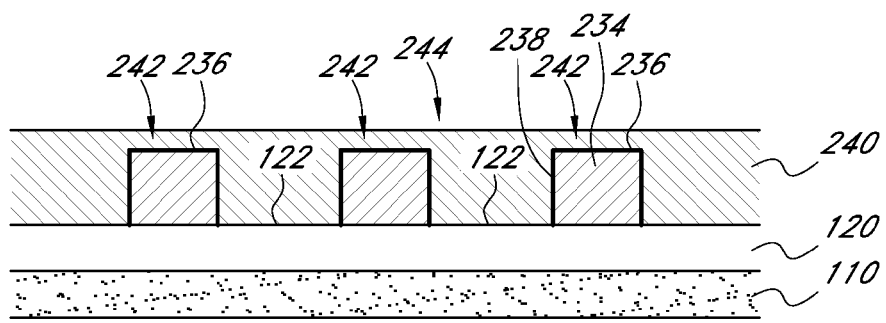

Referring to FIG. 3F, a second resist layer 240 is blanket deposited over the mandrels 234 and the exposed surfaces 122 of the hard mask layer 120. The second resist layer 240 can have a substantially planar top surface 244. The second resist layer 240 may be formed of a second resist material. The second resist material may be of the same composition as the first resist material or of a different composition from the first resist material. The first and second resist materials may be of the same or different type with regard to being positive or negative photoresist.

In some embodiments, the second resist material may include a chemically amplified photoresist. The chemically amplified photoresist may be an acid-catalyzed or base-catalyzed material. Examples of chemically amplified photoresists include, but are not limited to, 193 nm and 248 nm photo resists. Some Mine materials are also chemically amplified.

In certain embodiments, the second resist material may include a bottom anti-reflective coating (BARC) material modified to be suitable for a solubility change by acid or base diffusion. The skilled artisan will appreciate that any material showing a solubility change caused by the acid or base diffusion can be used in place of the second resist material.

The second resist layer 240 may be formed to have a thickness sufficient to cover the top surface 236 of the mandrels 234. Portions 242 of the second resist layer 240 overlying the top surfaces 236 of the mandrels 234 can be referred to as "top coat" in the context of this document. The top coats 242 may have a thickness selected such that all the resulting masking features have substantially the same height after the frozen mandrels 234 and other features that will be formed from portions of the second resist layer 240 are subjected to development. The resulting masking features will form a pattern to be transferred into the underlying target layer 110.

Figure 3G:
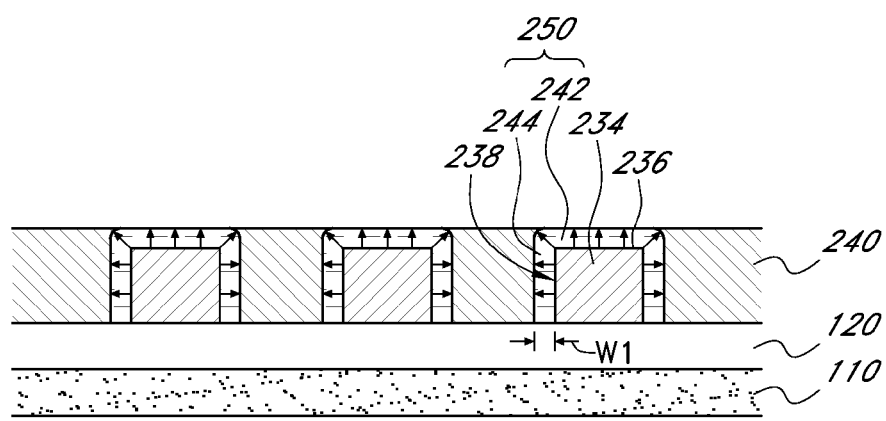

Referring to FIG. 3G, the structure of FIG. 3F is subjected to a bake. In one embodiment, the bake may be conducted at a temperature of about 110° C. to about 220° C. for about 0.5 min. to about 3 min. In another embodiment, the bake may be conducted at a temperature of about 110° C. to about 160° C. In embodiments where the second resist layer 240 is formed of an acid-catalyzed chemically amplified resist, the bake drives an acid-catalyzed reaction that alters the solubility of the second resist layer 240 in a developer. The acid-catalyzed reaction changes portions 250 of the second resist layer 240 that are proximate to the mandrels 234, causing those changed portions to become soluble in the developer. The portions 250 of the second resist layer 240 may include the top coats 242 of the second resist layer 240 and portions 244 adjoining the side surfaces 238 of the mandrels 234. The portions 250 that become soluble can be referred to as "anti-spacers."

The acid-catalyzed reaction is initiated at or near the top and side surfaces 236, 238 of the mandrels 234 during the bake step. For example, an acid diffused into the mandrels 234 during the step of FIG. 3D now diffuses into the top coats 242 and the adjoining portions 244 of the second resist layer 240 (as indicated by arrows in FIG. 3G), and changes the solubility of the portions 242, 244, thereby forming anti-spacers 250 around and on top of the mandrels 234. The width W1 of the anti-spacers 250 can be controlled by changing, for example, the bake time and/or temperature, the porosity of layer 240, and the size of acid species.

In other embodiments where the second resist layer 240 is formed of a base-catalyzed chemically amplified resist, the bake drives a base-catalyzed reaction that may alter the solubility of the second resist layer 240 in a developer. In such an embodiment, a base solution is provided in the step of FIG. 3D, rather than an acid solution. The skilled artisan will appreciate that anti-spacers can be formed in the same manner as in the embodiment described herein in connection with FIG. 3G.

In certain embodiments, other portions (not shown) of the second resist layer 240 may be optionally exposed to a pattern of light before or after the bake step. This exposure step can be used to form patterns in the other areas by photolithography, rather than by forming anti-spacers. During this optional exposure step, the structure shown in FIG. 3F or 3G may be blocked from light, if the structures are formed of a positive photoresist. This optional exposure step can form structures larger in width than the structures shown in FIG. 3H. In certain embodiments, the optional exposure step can be used to form structures in a peripheral region of an IC device or substrate while methods employing anti-spacers can be used to form structures in an array region of the IC device or substrate.

Figure 3H:
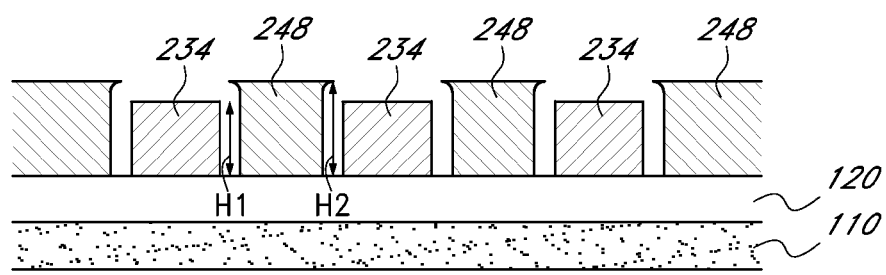

Referring to FIG. 3H, the structure resulting from the step of FIG. 3G is subjected to development which serves to selectively remove the anti-spacers 250. Any suitable developer may be used to remove the anti-spacers 250 (FIG. 3G). Examples of developers include, but are not limited to, sodium hydroxide and tetramethylammonium hydroxide (TMAH). In certain embodiments, rinsing solutions (e.g., propylene glycol monomethyl ether acetate (PGMEA) and/or propylene glycol monomethyl ether (PGME)) can also be used for the development. In one embodiment, this development step can be performed at room temperature for about 0.5 min. to about 3 min.

This step exposes the pre-existing mandrels 234 while defining intervening mask features 248 formed of the second resist material. The illustrated intervening mask features 248 have a T-shaped top portion, but the skilled artisan will appreciate that the shape of the intervening mask features 248 can vary, depending on the conditions (e.g., temperature, duration, etc.) of the development. The mandrels 234 may have a first height H1 and the intervening mask features 248 may have a second height H2 that is greater than the first height H1.

Figure 3I:
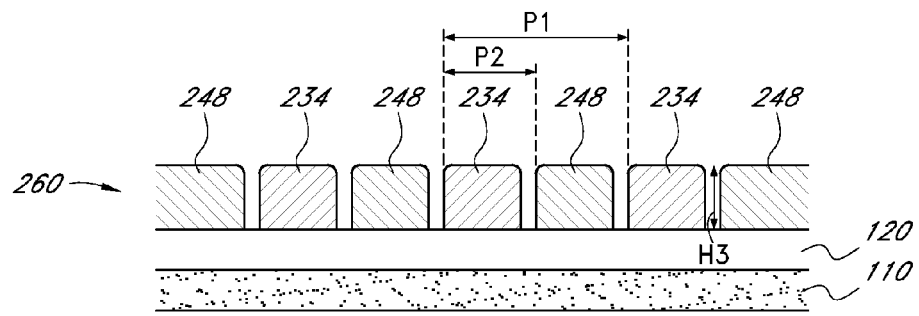

Referring to FIG. 3I, the developer may also anisotropically remove at least part of top portions of the mandrels 234 and the intervening mask features 248. The mandrels 234, which have been frozen, may be developed at a slower rate than the intervening mask features 248. Thus, after the completion of the development, the mandrels 234 and the intervening mask features 248 can have substantially the same height H3 as each other if the thicknesses of the top coats 242 of the second layer 240 have been selected such that the heights of the mandrels 234 and the intervening mask features 248 are substantially the same as each other after the development. As shown in FIG. 3I, both of the mandrels 234 and the intervening mask features 248 can have rounded top portions. In certain embodiments, an isotropic etch process may be conducted after the development to reduce the widths of the mandrels 234 and the intervening mask features 248.

The mandrels 234 and the intervening mask features 248 together provide a second pattern 260, as shown in FIG. 3I. The second pattern 260 has a second pitch P2 between neighboring features. The second pitch P2 is about half of the first pitch P1 in the illustrated embodiment.

Figure 3J:
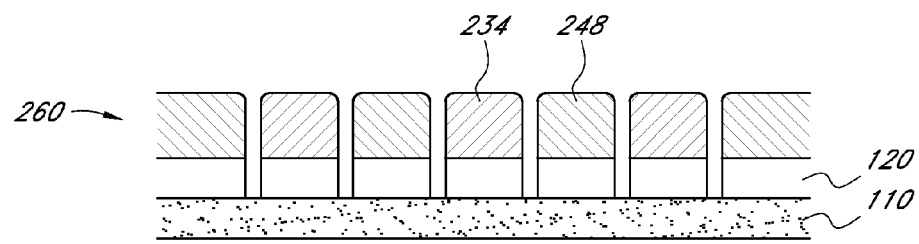

Referring to FIG. 3J, an etch step is conducted to transfer the second pattern 260 into the underlying hard mask layer 120. The second pattern 260 may be transferred into the hard mask layer 120 using any suitable etch process. The etch process can be a dry or wet etch process. In one embodiment, the etch process can be a plasma etch process, for example, a high density plasma etch process. The plasma etch process may be an anisotropic etch process.

Figure 3K:
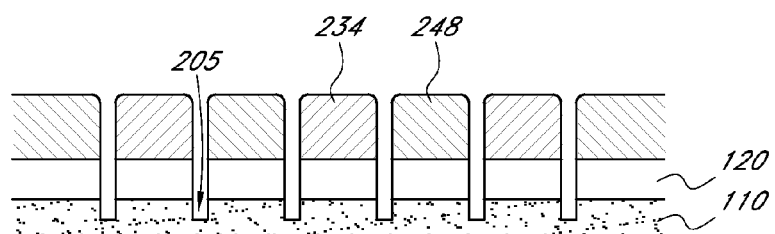

Referring to FIG. 3K, the target layer 110 is etched through the hard mask layer 120. As a result, trenches or troughs 205 are formed in the target layer 110. In some embodiments, through-holes can be formed through the target layer 110.

In certain embodiments, an etch stop layer (not pictured) can be used between the hard mask layer 120 and the target layer 110. The etch stop can be made of, for example, DARC or silicon nitride, depending upon the composition of the target layer 110. The etch stop avoids damage to the target layer 110 during the etching of the hard mask layer 120, such as during pattern transfer to the hard mask layer 120 or during removal of the hard mask layer 120. This may be particularly desirable when the target layer 110 is a metal, such as a metallization layer.

When processing (e.g., etching) of the target layer is completed, the hard mask layer 120 and the overlying features 234, 248 may be removed by etch processes, such as a wet etch. Subsequently, additional steps such as metallizations may be conducted to form integrated circuits.

Figure 4A:
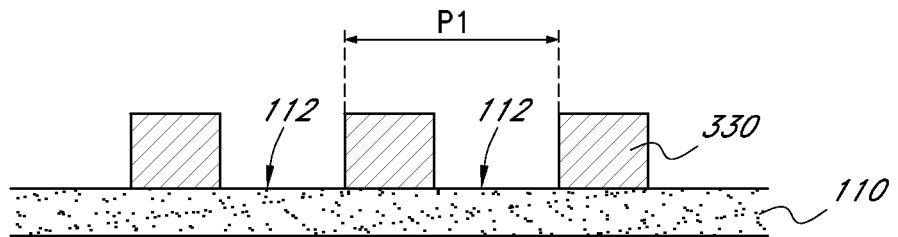
FIGS. 4A-4H are schematic, cross-sectional views showing a process sequence for forming features in a target layer, in accordance with other embodiments.

FIGS. 4A-4H illustrate a method of forming a masking pattern using anti-spacers in accordance with other embodiments. In these embodiments, the mandrels are formed from a hard mask layer or other material other than a photoresist layer. Referring to FIG. 4A, the method includes providing the target layer 110. Details of the target layer 110 can be as described above in connection with FIG. 3A.

A hard mask layer is formed over the target layer 110. In some embodiments, the hard mask layer may be formed of a silicon-containing organic material. The silicon-containing organic layer may contain silicon in an amount from about 10 wt % to about 35 wt % with reference to the total weight of the layer. An example of a silicon-containing organic materials includes, but is not limited to, SHB-A629 (available from Shin Etsu, Tokyo, Japan). In such an embodiment, the hard mask layer may have a thickness of between about 40 nm and about 800 nm, optionally between about 1 μm and about 3 μm.

The hard mask layer is then patterned to form mandrels 330, as shown in FIG. 4A. The hard mask layer can be patterned using any suitable process, including, but not limited to, a photolithographic process in which photoresist is patterned and the pattern is transferred to the hard mask layer. The mandrels 330 are spaced apart from one another and have a first pitch P1 and expose surfaces 112 of the target layer 110.

Figure 4B:
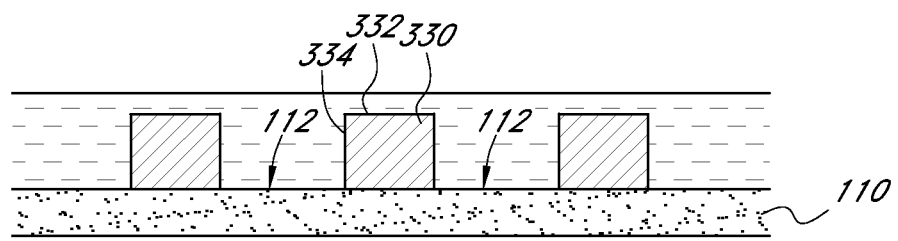
Figure 4C:
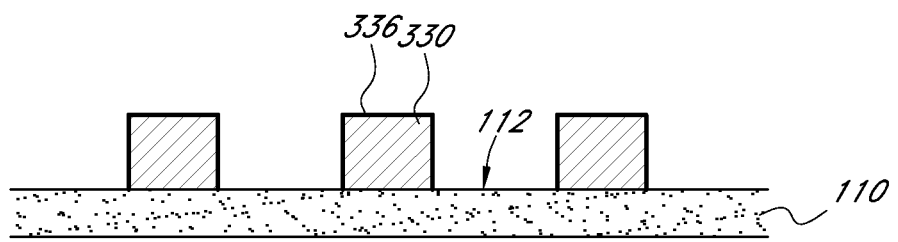

Referring to FIG. 4B, a chemically active species, for example, an acid solution, is deposited on the structure shown in FIG. 4A. In one embodiment, the acid solution can be spin-on deposited on the structure to cover the mandrels 330 and the exposed surfaces 112 of the target layer 110. The acid solution can include any organic acid, such as a PAG. Subsequently, a bake process is conducted to thermally diffuse the acid into at least portions of the mandrels 330 proximate to the top and side surfaces 332, 334 of the mandrels 330. In this embodiment, the mandrels 330 are at least partially permeable to the acid while the target layer 110 is substantially impermeable to the acid. Thus, the mandrels 330 can have an acid coat 326 on the surfaces 332, 334 thereof while the exposed portions 112 of the target layer 110 do not have an acid coat formed thereon, as shown in FIG. 4C. In other embodiments, the chemically active species may be in the form of a gas or may be in the solid state.

Figure 4D:
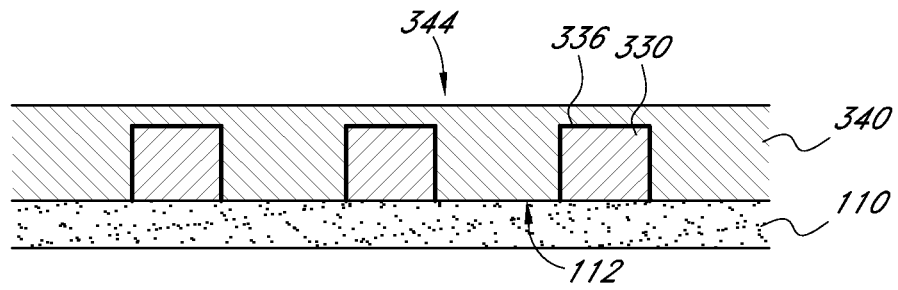

Referring to FIG. 4D, a resist layer 340 is formed over the mandrels 330 and the exposed portions 112 of the target layer 110 and may have a substantially planar top surface 344. The resist layer 340 may be formed of a resist material that is the same as the second resist material described above in connection with FIG. 3F. In one embodiment, the resist material may include a chemically amplified resist. The chemically amplified resist may be either acid-catalyzed or base-catalyzed. In other embodiments where the resist material is a base-catalyzed resist, a base coat (rather than an acid coat) is provided over the mandrels 330 and the exposed portions 112 of the target layer 110 in the step of FIG. 4C. Other details of forming the resist layer 340 can be as described above in connection with FIG. 3F.

Figure 4E:
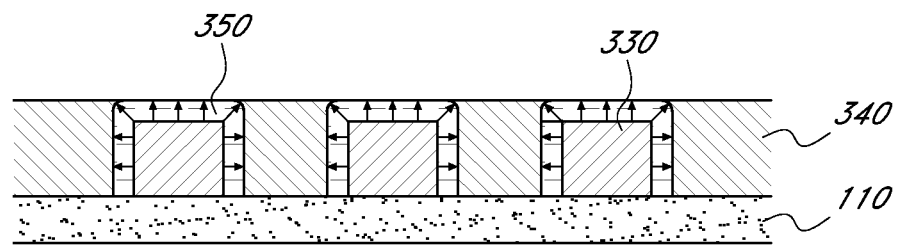

Referring to FIG. 4E, the structure resulting from the step of FIG. 4D is subjected to a bake. The bake forms anti-spacers 350 at the sides and on top of the mandrels 330. Other details of the bake step can be as described in connection with FIG. 3G.

In certain embodiments, other portions (not shown) of the resist layer 340 may be optionally exposed to a pattern of light before or after the bake step of FIG. 4E. This exposure step can be used to form patterns in the other portions by photolithography, rather than by forming anti-spacers. During this optional exposure step, the structure shown in FIG. 4E may be blocked from light, if the structures are formed of a positive photoresist. This optional exposure step can form structures larger in width than the structures shown in FIG. 4F. In certain embodiments, the optional exposure step can be used form structures in a peripheral region of an IC device or substrate while methods employing anti-spacers can be used to form structures in an array region of the IC device or substrate.

Figure 4F:
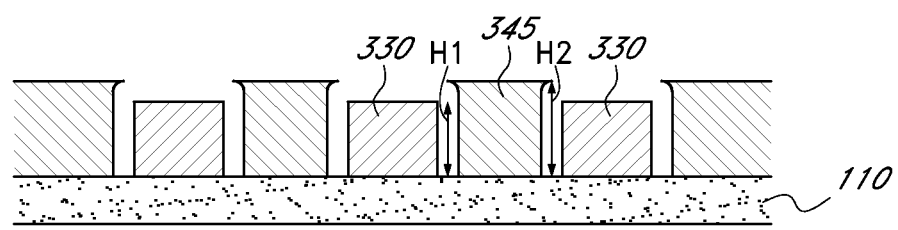

Referring to FIG. 4F, the structure resulting from the step of FIG. 4E is subjected to development to remove the anti-spacers 350. This step exposes the pre-existing mandrels 330 formed of the hard mask material while forming intervening mask features 345 formed of the resist material. The illustrated intervening mask features 345 have a T-shaped top portion, but the skilled artisan will appreciate that the shape of the intervening mask features 345 can vary, depending on the conditions (e.g., temperature, duration, etc.) of the development. The mandrels 330 may have a first height H1 and the intervening mask features 345 have a second height H2 that is greater than the first height H1.

Figure 4G:
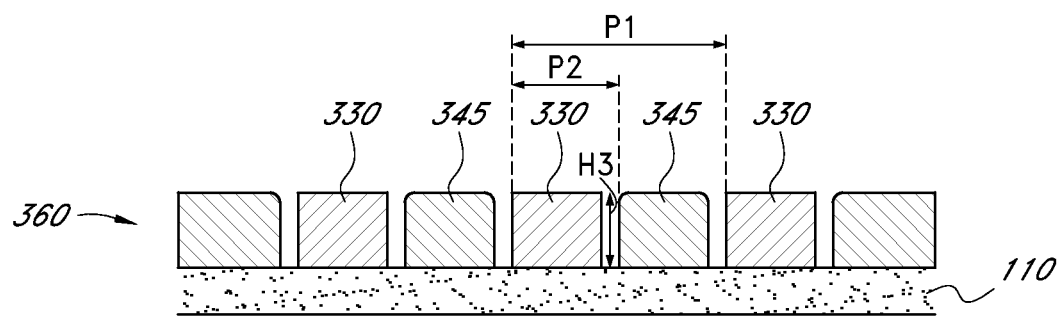

The developer can also remove at least part of the top portions of the intervening mask features 345. However, the mandrels 330, which are formed of a hard mask material, may not be eroded by the developer. Thus, after the completion of the development, the mandrels 330 and the intervening mask features 345 may have substantially the same height H3 as each other. As shown in FIG. 4G, the mandrels 330 may retain their original shape while the intervening mask features 345 may have rounded top portions.

The mandrels 330 and the intervening mask features 345 together provide a second pattern 360, as shown in FIG. 4G. The second pattern 360 has a second pitch P2 between a mandrel 330 and a neighboring intervening mask feature 345. The second pitch P2 is about half of the first pitch P1 in the illustrated embodiment.

Figure 4H:
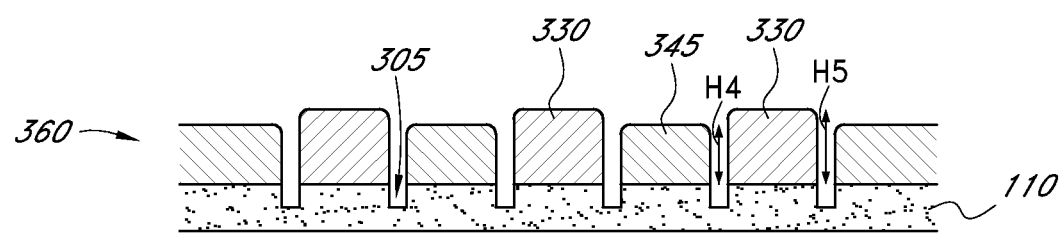

Referring to FIG. 4H, an etch step is conducted to transfer the second pattern 360 into the target layer 110. The second pattern 360 may be transferred into the target layer 110 using any suitable etch process. The etch process can be a dry or wet etch process. In one embodiment, the etch process can be a plasma etch process, optionally a high density plasma etch process. The plasma etch process may be an anisotropic etch process. Other details of this step can be as described above in connection with FIG. 3K.

In the illustrated embodiment, trenches or troughs 305 (or through-holes in other embodiments) are formed in the target layer 110. Because the mandrels 330 (formed of a hard mask material) may be etched at a faster rate than the intervening mask features 345 (formed of a photoresist) during the transfer step of FIG. 4H, the height H4 of the remaining mandrels 330 may be greater than the height H5 of the remaining intervening mask features 345 after the completion of the transfer step.

When processing (e.g., etching) of the target layer 110 is completed, the mandrels 330 and the intervening mask features 345 may be removed by known etch processes, such as a wet etch step. Subsequently, additional steps such as metallization may be conducted to complete integrated circuits.

Figure 5A:
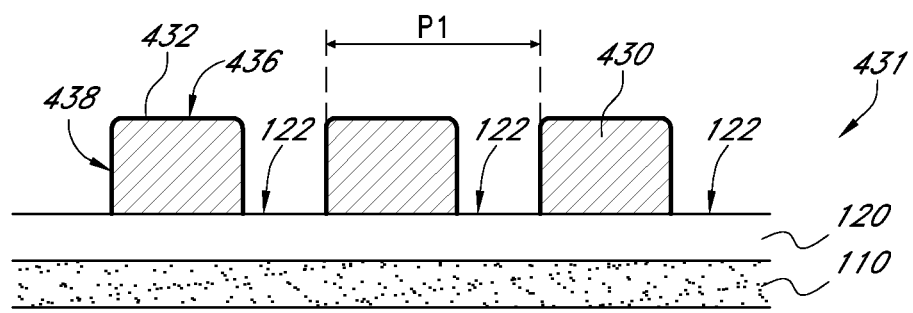
FIGS. 5A-5D are schematic, cross-sectional views showing a process sequence for forming features in a target layer, in accordance with yet other embodiments.

FIGS. 5A-5D illustrate a method of forming a masking pattern using anti-spacers in accordance with yet other embodiments. Referring to FIG. 5A, the method includes providing the target layer 110. Details of the target layer 110 can be as described above in connection with FIG. 3A. Hard mask layer 120 is formed on the target layer 110. Details of the hard mask layer 120 can be as described above in connection with FIG. 3A. In certain embodiments, the hard mask layer 120 may be omitted.

Then, mandrels 430 are formed of a photoresist material on the hard mask layer 120. Details of forming the mandrels 430 can be as described above in connection with FIGS. 3A-3C. The mandrels 430 provide a first pattern 431 while exposing surfaces 122 of the hard mask layer 120. The first pattern 431 has a first pitch P1 between two neighboring mandrels 430, as shown in FIG. 5A. Each of the mandrels 430 has a top surface 436 and a side surface 438. The illustrated mandrels 430 have a substantially rectangular or square cross-section. The skilled artisan will, however, appreciate that the cross-sectional shape of the mandrels 430 can be different from that illustrated.

Then, a chemically active species 432, for example, an acid or base solution, is deposited on the structure shown in FIG. 5A. In some embodiments, the acid or base solution can be spin-on deposited on the structure to cover the mandrels 430 and the exposed portions 122 of the hard mask layer 120. The details of the acid or base solution can be as described above in connection with FIG. 3D.

Figure 5B:
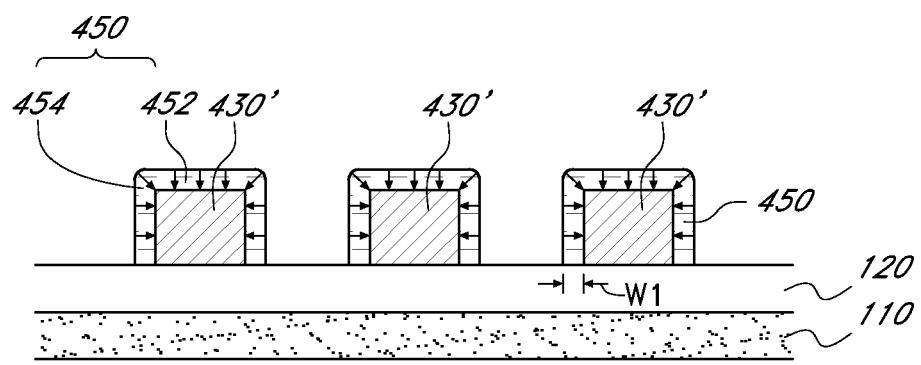

Referring to FIG. 5B, the structure of FIG. 5A is subjected to a bake. The details of the bake can be as described above in connection with FIG. 3G. The bake drives an acid- or base-catalyzed reaction that alters the solubility of portions 452, 454 of the mandrels 430. The acid- or base-catalyzed reaction changes top portions 452 and side portions 454 of the mandrels 430, causing those changed portions to become soluble in a developer. The top and side portions 452, 454 of the mandrels 430 form anti-spacers 450. Thus, the resulting mandrels 430' have a reduced size both vertically and horizontally. Such mandrels 430' can be referred to as reduced mandrels in the context of this document.

Subsequently, the reduced mandrels 430' covered with the anti-spacers 450 may be subjected to a surface treatment. Surfaces of the anti-spacers 450 are modified such that the integrity of the mandrels is maintained while a second resist layer is formed thereon. The details of the surface treatment can be as described above in connection with FIG. 3E.

Figure 5C:
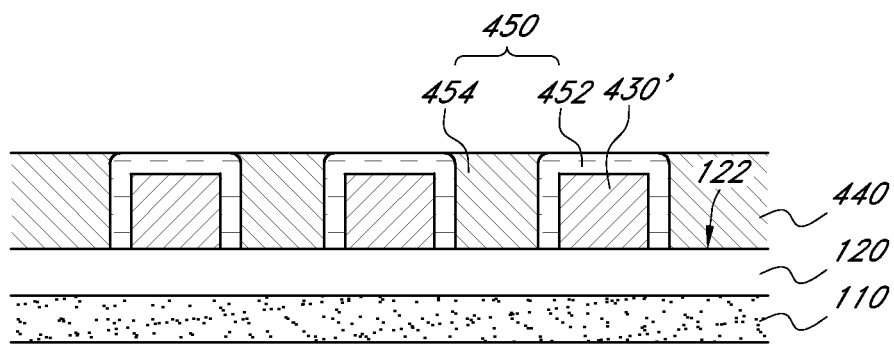

Referring to FIG. 5C, a second masking layer 440 is blanket deposited over the anti-spacers 450 and the exposed surfaces 122 of the hard mask layer 120. In other embodiments, the second masking layer may have a smaller height than the anti-spacers such that the second masking layer surrounds sidewalls of the anti-spacers while exposing top surfaces of the anti-spacers. The second masking layer 440 may be formed of an image reversal material, such as an Image Reversal Overcoat (IROC) material and other similar materials, e.g., as outlined in US Patent Application Publication No. 2009/0081595 from Shin-Etsu Chemical Co., Ltd (Tokyo, Japan). Bottom Anti-Reflection Coating (BARC) materials can also be used for the second masking layer 440. Other details of this step can be as described above in connection with FIG. 3F.

In the illustrated embodiment, the second masking layer 440 may be formed to have a thickness sufficient to cover the top portions 452 of the anti-spacers 450. Portions of the second masking layer 440 overlying the top portions 452 of the anti-spacers 450 may be referred to as "top coats" in the context of this document.

Figure 5D:
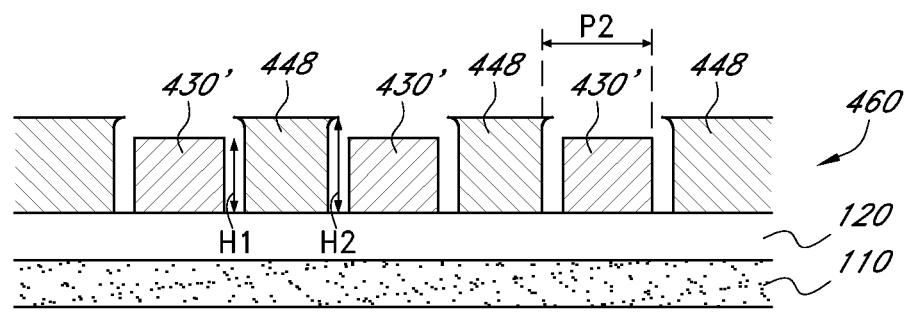

Referring to FIG. 5D, the structure resulting from the step of FIG. 5C is subjected to development. Any suitable developer may be used to remove the anti-spacers 450 (FIG. 5C). This step exposes the reduced mandrels 430' while defining intervening mask features 448 formed of the material of the second masking layer 440.

The reduced mandrels 430' and the intervening mask features 448 together provide a second pattern 460. The second pattern 460 has a second pitch P2 between a reduced mandrel 430' and a neighboring intervening mask feature 448. The second pitch P2 is about half of the first pitch P1 (FIG. 5A) in the illustrated embodiment. Other details of this step can be as described above in connection with FIG. 3H. The step shown in FIG. 5D can be followed by steps as described above in connection with FIGS. 3I to 3K to transfer the second pattern 460 into the target layer 110.

In some other embodiments, mandrels defining a first pattern are formed in a first masking layer provided over a target layer. One or more sacrificial structures may be formed by conformally growing or depositing a layer to cover at least exposed sidewall surfaces of the mandrels. The layer may be formed of a material that is different from that of the first masking layer.

A second masking layer is deposited to fill spaces defined by the mandrels covered with the sacrificial structures. In some embodiments, the second masking layer may cover top surfaces and sidewalls of the mandrels covered with the sacrificial structures. In such embodiments, an additional step(s), e.g., a descum step, can be performed to remove portions of the second masking layer over the sacrificial structures to expose top surfaces of the sacrificial structures. In other embodiments, the second masking layer may have a smaller height than the anti-spacers such that the second masking layer surrounds sidewalls of the anti-spacers while exposing top surfaces of the anti-spacers. The second masking layer may be formed of a material different from the material of the sacrificial structures.

Then, the sacrificial structures are removed, exposing the mandrels. The remaining parts of the second masking layer form intervening masking features. The mandrels and the intervening mask features together define a second pattern. The second pattern is transferred into the target layer.

FIGS. 6A-6E illustrate a method of forming a masking pattern by growing anti-spacers. In these embodiments, mandrels may be formed from a hard mask layer or other material other than a photoresist layer, as discussed with reference to FIG. 4A.

Figure 6A:
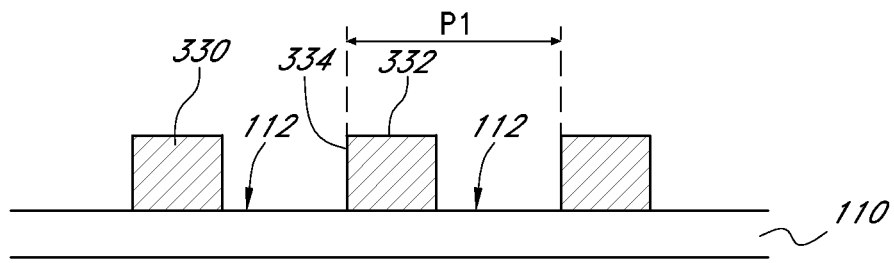
FIGS. 6A-6E are schematic, cross-sectional views showing a process sequence for forming features in a target layer, in accordance with yet other embodiments.

Referring to FIG. 6A, the target layer 110 is provided. Details of the target layer 110 can be as described above in connection with FIG. 3A. A hard mask layer is formed over the target layer 110, and is patterned to form mandrels 330, as shown in FIG. 6A. The mandrels 330 are spaced apart from one another with a first pitch P1 while exposing surfaces 112 of the target layer 110. Each of the mandrels 330 has a top surface 332 and side surfaces 334. Other details of this step can be as described above in connection with FIG. 4A.

Figure 6B:
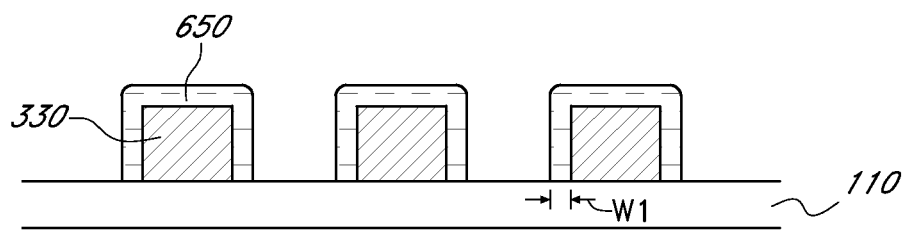

Referring to FIG. 6B, a sacrificial material, such as an organic material, is grown on the top and side surfaces 332, 334 of the mandrels 330, while exposing substantial portions of the exposed surfaces 112 of the target layer 110. Examples of such organic materials include, but are not limited to, perhydropolysilazane (PHPS) or polyhedral oligomeric silsesquioxanes (POSS). The organic material can be grown by a diffusion limited growth technique. In some embodiments, the reaction temperature may be between about 100° C. and about 180° C., which may be below the glass transition temperature Tg of the original mandrel material. Attachment of the sacrificial material may be catalyzed by another wet treatment or a material that may be present in the chemical formulation of the mandrel. Critical dimensions can then be modulated by controlling reaction temperature in combination with the chemical compositions used in the sacrificial material. The organic material forms anti-spacers 650 that include top portions 652 and side portions 654 covering the top and side surfaces 332, 334, respectively, of the mandrels 330.

Figure 6C:
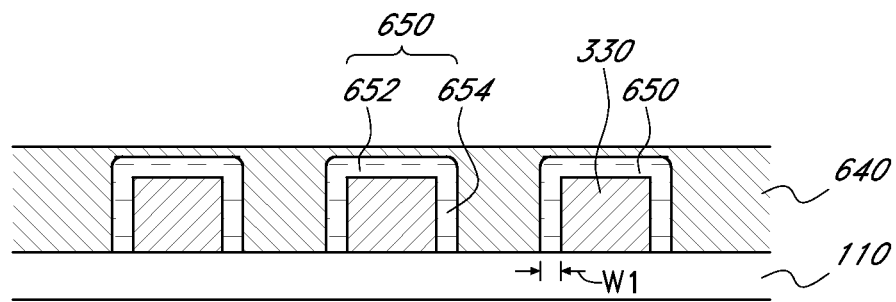

Referring to FIG. 6C, a second masking layer 640 is blanket deposited by, for example, spin-on deposition, over the anti-spacers 650 and the exposed surfaces 112 of the target layer 110. The second masking layer 440 may be formed of a silicon hard mask material, such as STH1125B manufactured by Shin-Etsu Chemical Co., Ltd (Tokyo, Japan) or similar commercial hardmask material readily available to those versed in the art. Other details of this step can be as described above in connection with FIG. 5C. In the illustrated embodiment, the second masking layer 640 may be formed to have a thickness sufficient to slightly cover top portions 652 of the anti-spacers 650. Portions of the second masking layer 640 overlying the top portions 652 of the anti-spacers 650 may be referred to as "top coats" in the context of this document.

Figure 6D:
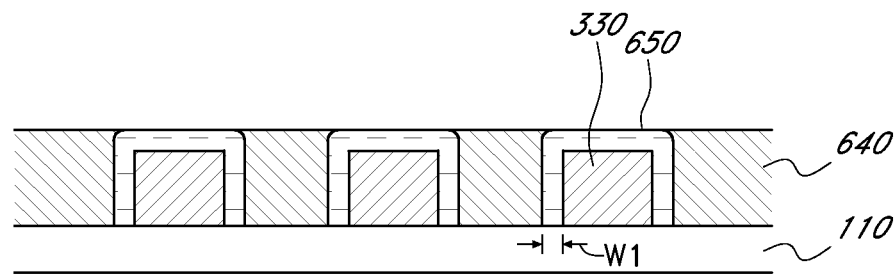

Referring to FIG. 6D, the structure resulting from the step of FIG. 6C is subjected to a chemical descum process. The chemical descum process serves to remove the top coats of the second masking layer 640, thereby exposing the top portions 652 of the anti-spacers 650. As non-limiting examples, the chemical descum may be performed using a wet etch or a plasma etch such as a buffered oxide etch (BOE) dip process or Argon sputter etch. Tetramethylammonium hydroxide (TMAH) developer can also be used to clean up these feature areas at a temperature ranging from about 10° C. to about 50° C.

Figure 6E:
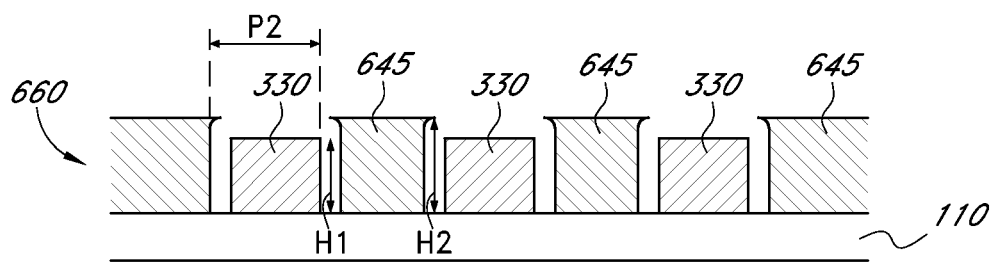

Referring to FIG. 6E, the structure resulting from the step of FIG. 6D is subjected to an etch process to remove the anti-spacers 650. Any suitable etchant may be used to remove the anti-spacers 650, depending on the organic material. In some embodiments where the organic material is a pure hydrocarbon-based material, the etchant can be a dry etchant, such as $O_2$ or halide-based plasma, or a wet etchant, such as tetramethylammonium hydroxide (TMAH), propylene glycol monomethyl ether (PGME), propylene glycol monomethyl ether acetate (PGMEA), or any other suitable organic solvent. This step exposes the mandrels 330 formed of the hard mask material while defining intervening mask features 645 formed of the silicon hard mask material or mandrel material that may have used a process to ensure that its solubility is compatible with the wet etch. For the purpose of this document, such processes can be "freeze" techniques and they serve to limit the solubility of the mandrels in a wet etch process. These "freeze" techniques can take on various forms, for example, a thermal cross linking agent in a resist.

The mandrels 330 and the intervening mask features 645 together define a second pattern 660. The second pattern 660 has a second pitch P2 between a mandrel 330 and a neighboring intervening mask feature 645. The second pitch P2 is about half of the first pitch P1 in the illustrated embodiment. Other details of this step can be as described above in connection with FIG. 3H. The step shown in FIG. 6E can be followed by steps as described above in connection with FIGS. 3I to 3K to transfer the second pattern 660 into the target layer 110.

FIGS. 7A-7F illustrate a method of forming a masking pattern using anti-spacers in accordance with yet other embodiments. In these embodiments, mandrels may be formed from a hard mask layer or any other suitable material, using a process that allows selective growth of anti-spacers. A photoresist can be used in the step shown in FIG. 7A as long as it is appropriately mated to the processing requirements, e.g., with regard to solubility. In such an embodiment, a photoresist used herein can withstand subsequent process steps. This can be achieved with a different solvent resist system, such as an alcohol-based resist or can be achieved with a "freeze" technique.

Figure 7A:
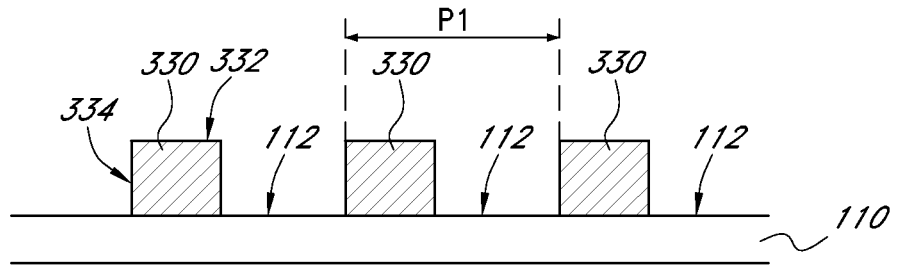
FIGS. 7A-7F are schematic, cross-sectional views showing a process sequence for forming features in a target layer, in accordance with yet other embodiments.

Referring to FIG. 7A, the method includes providing the target layer 110. Details of the target layer 110 can be as described above in connection with FIG. 3A. A hard mask layer is formed over the target layer 110, and is patterned to form mandrels 330, as shown in FIG. 7A. The mandrels 330 are spaced apart from one another with a first pitch P1 while exposing surfaces 112 of the target layer 110. Each of the mandrels 330 has a top surface 332 and side surfaces 334. Other details of this step can be as described above in connection with FIG. 4A.

Figure 7B:
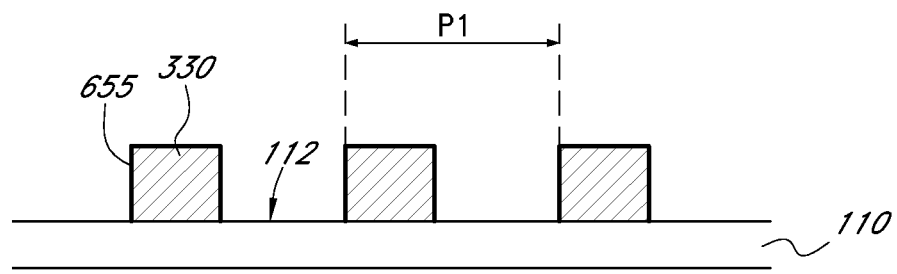

Referring to FIG. 7B, a reactivity promoter 655 is deposited on the top and side surfaces 332, 334 of the mandrels 330 without covering the exposed surfaces 112 of the target layer 110. The reactivity promoter serves to facilitate the growth of an organic material on the surfaces of the mandrels 330 at the next step. Examples of such reactivity promoters include, but are not limited to, AZ materials used in RELACS (Resolution Enhancement Lithography Assisted by Chemical Shrink) processes, and a material including a hydroxyl group or organic acid designed to condition the reactivity of the mandrels to a material that covers the mandrels.

Figure 7C:
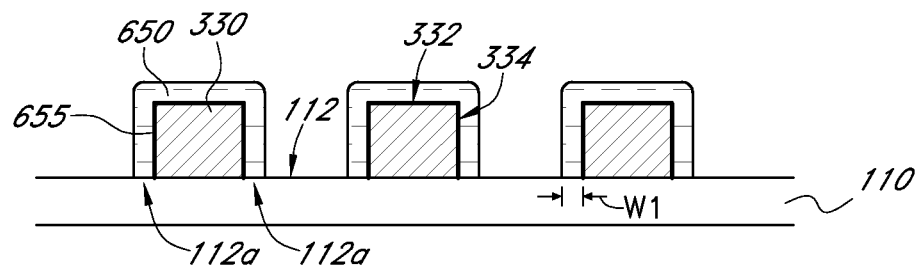

Referring to FIG. 7C, a sacrificial material, such as an organic material, is grown on the top and side surfaces 332, 334 of the mandrels 330 that are covered with the reactivity promoter 655. The organic material does not cover the exposed surfaces 112 of the target layer 110 except for portions 112a of the exposed surfaces 112 proximate to the mandrels 330. Examples of such organic materials include, but are not limited to, PHPS or a chain hydrocarbon with a bonding affinity to the mandrels covered with the reactivity promoter. The organic material can be grown by a diffusion limited growth technique by means of a fluid overcoat at a controlled temperature, for example, in a range between about 10° C. and about 180° C. The organic material forms anti-spacers 650 that cover the top and side surfaces 332, 334 of the mandrels 330.

Figure 7D:
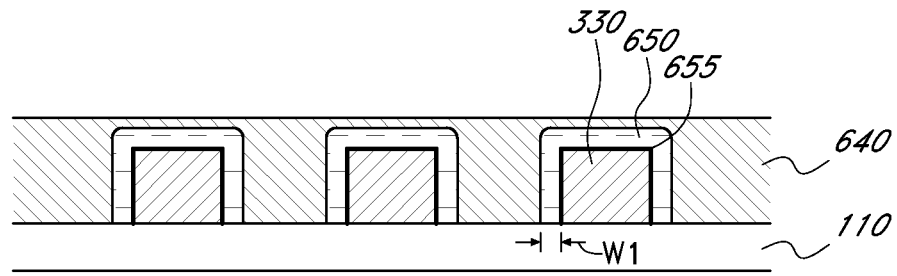

Referring to FIG. 7D, a second masking layer 640 is blanket deposited by, for example, spin-on deposition, over the anti-spacers 650 and the exposed surfaces 112 of the target layer 110. The second masking layer 640 can optionally cover top surfaces of the anti-spacers 650. The second masking layer 640 may be formed of, for example, a silicon hard mask material. The details of this step can be as described above in connection with FIG. 6C.

Figure 7E:
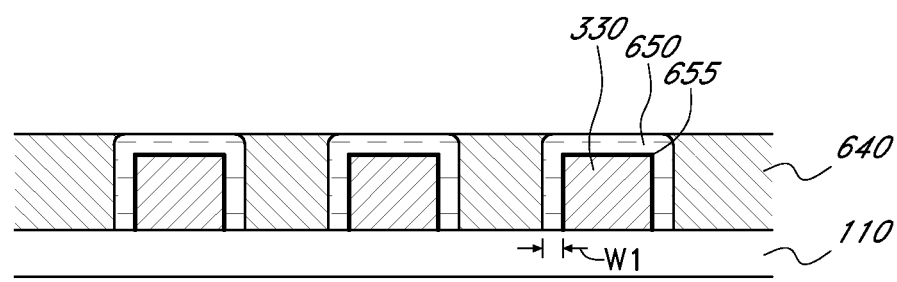

Referring to FIG. 7E, the structure resulting from the step of FIG. 7D is subjected to a chemical descum process. The details of this step can be as described above in connection with FIG. 6D.

Figure 7F:
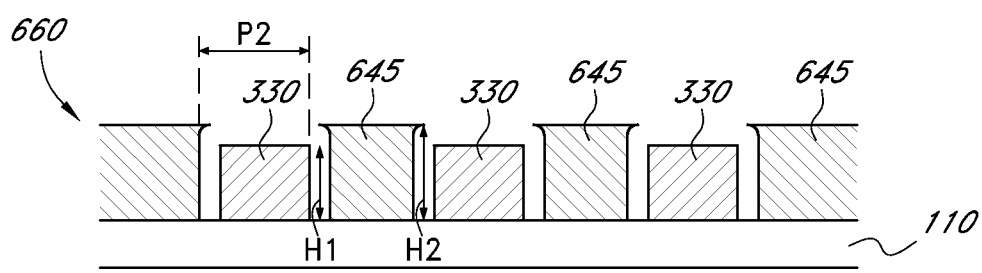

Referring to FIG. 7F, the structure resulting from the step of FIG. 7E is subjected to an etch process to remove the anti-spacers 650. The details of this step can be as described above in connection with FIG. 6E. This step exposes the mandrels 330 formed of the hard mask material while defining intervening mask features 645 formed of the material forming the second masking layer 640, e.g., a silicon hard mask material.

The mandrels 330 and the intervening mask features 645 together define a second pattern 660. The second pattern 660 has a second pitch P2 between a mandrel 330 and a neighboring intervening mask feature 645. The second pitch P2 is about half of the first pitch P1 in the illustrated embodiment. Other details of this step can be as described above in connection with FIG. 3H. The step shown in FIG. 7F can be followed by steps as described above in connection with FIGS. 3I to 3K to transfer the second pattern 660 into the target layer 110.

FIGS. 8A-8F illustrate a method of forming a masking pattern using anti-spacers in accordance with yet other embodiments. In these embodiments, mandrels may be formed from a hard mask layer or any other suitable material compatible with blanket deposition of an anti-spacer material, including materials discussed with reference to FIG. 4A.

Figure 8A:
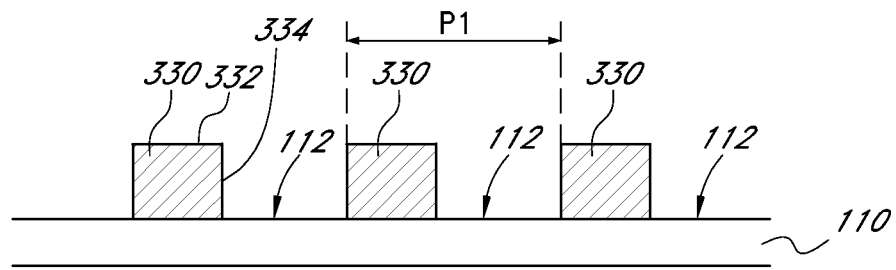
FIGS. 8A-8E are schematic, cross-sectional views showing a process sequence for forming features in a target layer, in accordance with yet other embodiments.

Referring to FIG. 8A, the method includes providing a target layer 110. Details of the target layer 110 can be as described above in connection with FIG. 3A. A hard mask layer is formed over the target layer 110, and is patterned to form mandrels 330, as shown in FIG. 8A. The mandrels 330 are spaced apart from one another with a first pitch P1 while exposing surfaces 112 of the target layer 110. Each of the mandrels 330 has a top surface 332 and side surfaces 334. Other details of this step can be as described above in connection with FIG. 4A.

Figure 8B:
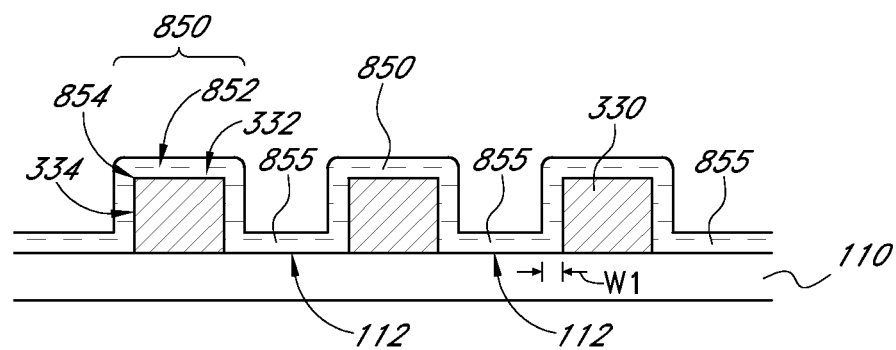

Referring to FIG. 8B, a sacrificial material is conformally deposited on the top and side surfaces 332, 334 of the mandrels 330 and the exposed surfaces 112 of the target layer 110. Examples of such sacrificial materials include, but are not limited to, BARC, DARC, photoresist, silicon-on-glass (SOG), and hardmask type material. The sacrificial material can be deposited by, for example, spin-on coat or deposition. Portions 852, 854 of the sacrificial material that cover the top and side surfaces 332, 334, respectively, of the mandrels 330 form anti-spacers 850. Portions 855 of the sacrificial material formed on the surfaces 112 of the target layer 110 may be referred to as "partial gap fillers" in the context of this document.

Figure 8C:
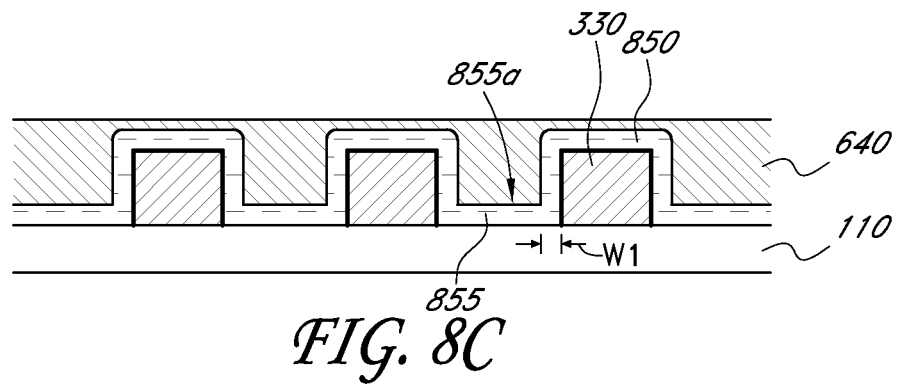

Referring to FIG. 8C, a second masking layer 640 is deposited over the partial gap fillers 855 and can also extend over the anti-spacers 850. Other details of this step can be as described above in connection with FIG. 6C.

Figure 8D:
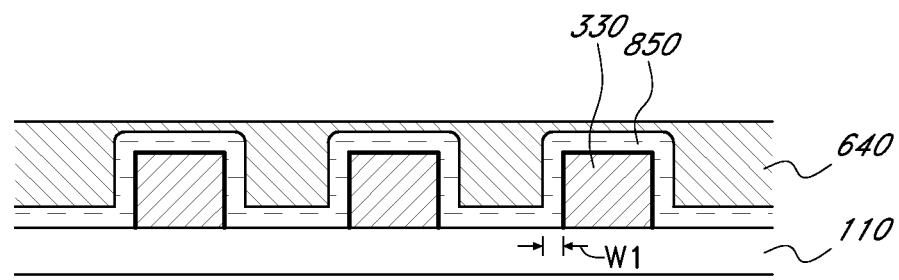

Referring to FIG. 8D, to expose anti-spacers 850 in embodiments where the anti-spacers 850 are covered, the structure resulting from the step of FIG. 8C is subjected to a chemical descum process. The details of this step can be as described above in connection with FIG. 6D.

Figure 8E:
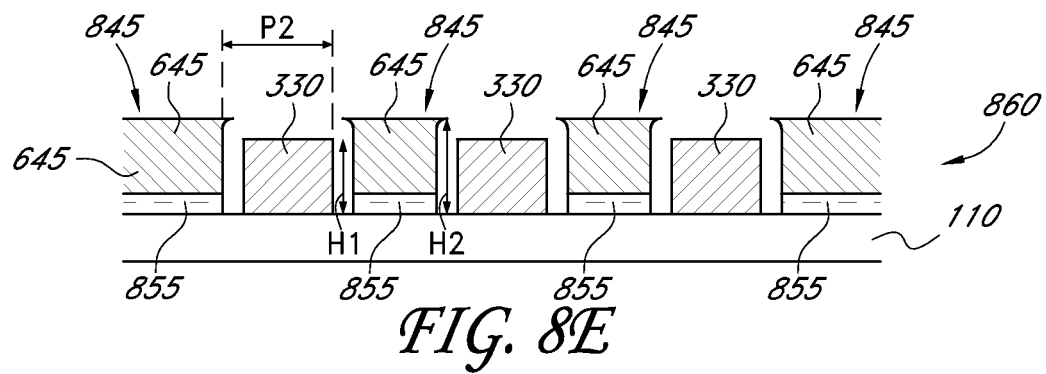

Referring to FIG. 8E, the structure resulting from the step of FIG. 8D is subjected to an etch process to remove the anti-spacers 850. The etch process may use an anisotropic etch process, using any suitable dry etchant, such as $C_2F_4$, $O_2$, Hbr, or $F_2$. In one embodiment where the organic material is a photoresist, the etchant can be a dry etchant, such as $C_2F_4$, $O_2$, Hbr, and $F_2$. This step exposes the mandrels 330 formed of the hard mask material while defining intervening mask features 845 between the mandrels 330. Each of the features 845 includes a structure 645 formed of the silicon hard mask material and a partial gap filler 855 underlying the structure 645.

The mandrels 330 and the intervening mask features 845 together define a second pattern 860. The second pattern 860 has a second pitch P2 between a mandrel 330 and a neighboring intervening mask feature 845. The second pitch P2 is about half of the first pitch P1 in the illustrated embodiment. Other details of this step can be as described above in connection with FIG. 3H. The step shown in FIG. 8E can be followed by steps as described above in connection with FIGS. 3I to 3K to transfer the second pattern 860 into the target layer 110.

In some embodiments, a masking pattern formed by the methods described herein may be used for further pitch multiplication. The pitch of the masking pattern may be further reduced by conducting an additional process using anti-spacers. For example, anti-spacers may be formed around the mask features left after anti-spacer removal, e.g., including the mandrels 234 and intervening mask features 248, as shown in FIG. 3I, and the pitch of the resulting features can be reduced to about half of the second pitch P2.

In such embodiments, a second set of anti-spacers are formed around and optionally over the mask features by repeating the steps of FIGS. 3D-3I, FIGS. 4A-4E, FIGS. 5A-5C, FIGS. 6A-6D, FIGS. 7A-7E, or FIGS. 8A-8D. In some embodiments, the second set of anti-spacers may be formed by depositing a third masking layer to at least partially bury the second pattern and chemically altering portions of the third masking layer to form the second set of anti-spacers, as in the steps shown in FIGS. 3D-3I, FIGS. 4A-4E, or FIGS. 5A-5C. In other embodiments, the second set of anti-spacers may be formed by growing a second set of anti-spacers on the mask features, as in the steps shown in FIGS. 6A-6D, FIGS. 7A-7E, or FIGS. 8A-8D, and a third masking layer is deposited to fill spaces between the mask features covered with the anti-spacers.

Subsequently, the second set of anti-spacers are removed while leaving at least portions of the third masking layer to form additional intervening mask features. The mandrels, the intervening mask features, and the additional intervening mask features together define a third pattern having a pitch that is about a half of the pitch of the second pattern. The skilled artisan will appreciate that further pitch multiplication is also possible by repeating the process of forming and removing anti-spacers. The steps described above can be repeated if desired for more pitch reduction.

In other embodiments, a masking pattern formed by the methods described above may be used for additional pitch multiplication in combination with a process employing so-called spacers.

FIGS. 9A-9D illustrate a method of forming a masking pattern, using anti-spacers and spacers in accordance with one embodiment. In the illustrated embodiment, features forming a masking pattern can have a smaller pitch than the pitches P2 of the second patterns 260, 360, 460, 660, and 860 described above in connection with FIGS. 3I, 4G, 5D, 6E, 7F, and 8E.

Figure 9A:
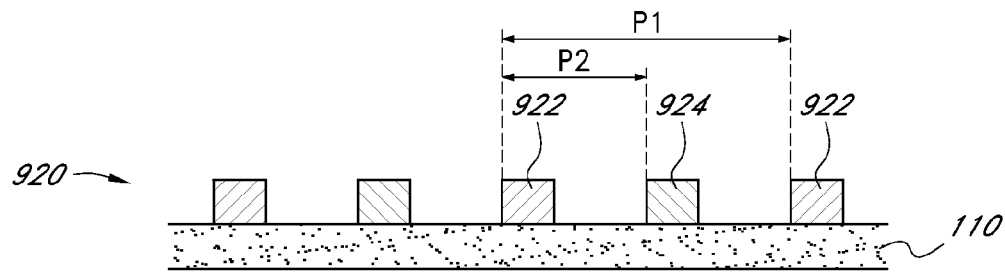
FIGS. 9A-9D are schematic, cross-sectional views showing a process sequence for forming features in a target layer, using anti-spacers and spacers, in accordance with yet other embodiments.

Referring to FIG. 9A, the target layer 110 is provided. The details of the target layer 110 can be as described above in connection with FIGS. 3A, 4A, 5A, 6A, 7A, and 8A.

A first pattern 920 is formed on the target layer 110. The first pattern 920 may include mandrels 922 and intervening mask features 924. In the context of this embodiment, the mandrels 922 and the intervening mask features 924 may be collectively referred to as "first masking features." The mandrels 922 and the intervening mask features 924 can be formed by the method described above in connection with FIGS. 3A-3I, FIGS. 4A-4G, FIGS. 5A-5D, FIGS. 6A-6E, FIGS. 7A-7F, or FIGS. 8A-8E. In certain embodiments, one or more hard mask layers (not shown) can be formed on the target layer 110, and the first pattern 920 can be formed on the one or more hard mask layers. The first pattern 920 may correspond to any one of the second patterns 260, 360, 460, 660, and 860 described above in connection with FIGS. 3I, 4G, 5D, 6E, 7F, and 8E.

As shown in FIG. 9A, the mandrels 922 have a first pitch P1 therebetween. In the first pattern 920, however, two neighboring first masking features (i.e., a mandrel 922 and a neighboring intervening mask feature 924) have a second pitch P2 that is about half of the first pitch P1. In some embodiments, the first masking features 922, 924 in the first pattern 920 may be trimmed or shrunk by an isotropic etching process to increase the distance between neighboring features.

Figure 9B:
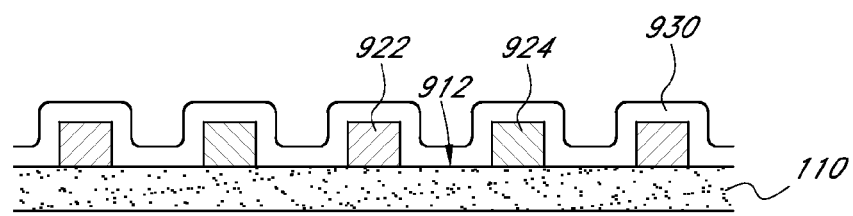

Next, as shown in FIG. 9B, a layer 930 of spacer material may be blanket-deposited conformally over exposed surfaces, including the target layer 110 and the tops and sidewalls of the first masking features 922, 924.

The spacer material can be any material capable of use as a mask to transfer a pattern to the underlying target layer 110. The spacer material preferably 1) can be deposited with good step coverage, 2) can be deposited at a temperature compatible with the target layer 110 and 3) can be selectively etched relative to the target layer 110. In one embodiment, the spacer material 930 is silicon oxide. In other non-limiting embodiments, the spacer material may be polysilicon or a low temperature oxide (LTO).

Figure 9C:
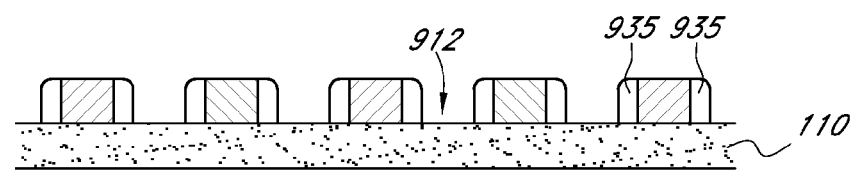

The spacer material may be deposited by any suitable method, including, but not limited to, chemical vapor deposition (CVD), atomic layer deposition (ALD), spin-coating, or casting. ALD may have the advantages of both low temperature deposition and high conformality. The thickness of the layer 930 corresponds to the width of the spacers 935 and may be determined based upon the desired width of those spacers 935 (FIG. 9C). For example, in some embodiments, the layer 930 may be deposited to a thickness of about 20-80 nm and, optionally, about 40-60 nm. In some embodiments, the step coverage is about 80% or greater and, optionally, about 90% or greater.

In certain embodiments, the spacer material may be one of a class of materials available from Clariant International, Ltd. (so-called "AZ R" materials), such as the materials designated as AZ R200™, AZ R500™, and AZ R600™. In other embodiments, the spacer material may be an "AZ R" material with one or more inorganic components (e.g., one or more of titanium, carbon, fluorine, bromine, silicon, and germanium) dispersed therein. The "AZ R" materials contain organic compositions which cross-link upon exposure to acid released from chemically-amplified resist. Specifically, an "AZ R" material may be coated across photoresist, and subsequently the resist may be baked at a temperature of about 100° C. to about 120° C. to diffuse acid from the resist and into the "AZ R" material to form chemical cross-links within regions of the material proximate the resist. Portions of the material adjacent the resist are thus selectively hardened relative to other portions of material in which acids have not diffused. The material may then be exposed to conditions which selectively remove the non-hardened portions relative to the hardened portions. Such removal may be accomplished using, for example, 10% isopropyl alcohol in the ionized water, or a solution marketed as "SOLUTION C™" by Clariant International, Ltd. The processes using the "AZ R" materials are sometimes considered examples of RELACS (Resolution Enhancement Lithography Assisted by Chemical Shrink) processes. Examples of spacers formed by RELACS processes are disclosed by U.S. patent application Ser. No. 12/125,725, filed May 22, 2008, entitled "METHODS OF FORMING STRUCTURES SUPPORTED BY SEMICONDUCTOR SUBSTRATES" (inventor: Anton deVilliers).

Referring to FIG. 9C, the spacer layer 930 is then subjected to an anisotropic etch to remove spacer material from horizontal surfaces 912 of the target layer 110 and the first masking features 922, 924. In an embodiment where the spacer layer 930 is formed of a silicon oxide material, an etch, also known as a spacer etch, can be performed on the silicon oxide material, using a fluorocarbon plasma, e.g., containing $CF_4/CHF_3$, $C_4F_8/CH_2F_2$ or $CHF_3/Ar$ plasma. The etchants are chosen to be selective for the spacer material relative to the target layer 110.

Figure 9D:
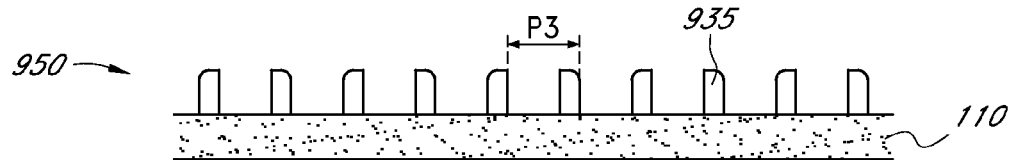

Referring to FIG. 9D, the first masking features 922, 924 are removed to leave freestanding spacers 935. In one embodiment, the first masking features 922, 924 may be removed by an oxygen-containing plasma etch, such as an etch using $HBr/O_2/N_2$ and $SO_2/O_2$.

In the illustrated embodiment, the spacers 935 form a second pattern 950 having a third pitch P3. The third pitch P3 is roughly half of the second pitch P2 between neighboring first masking features 922, 924 in the first pattern 920. For example, where the first pitch P1 is about 200 nm, spacers 935 having a pitch of about 50 nm or less can be formed.

Next, the second pattern 950 provided by the spacers 935 is transferred into the target layer 110 (not shown). The pattern transfer can be performed using any suitable etch process selective for the target layer 110 relative to the spacers 935. Other details of this step can be as described above with reference to FIG. 3K or 4H. The target layer 110 may be further processed to form complete IC devices.

In some embodiments, three dimensional structures can be formed by the methods described above. The three dimensional structures can include, but are not limited to, lines, trenches, vias, pillars, posts, troughs, and moats.

FIGS. 10A-12C illustrate a method of forming an array of isolated trenches or vias in a target layer, using anti-spacers in accordance with some embodiments. In one embodiment, referring to FIGS. 10A and 10B, mandrels 1020 extending in the y-direction are formed by, for example, depositing and patterning a first resist layer on the target layer 110, as described above in connection with FIG. 3C. A second resist layer 1040 is formed over the mandrels 1020 and the target layer 110. First anti-spacers 1050 extending in the y-direction are formed around and on top of the mandrels 1020, thereby defining intervening mask features 1048 extending in the y-direction. The details of these steps can be as described above in connection with FIGS. 3D-3G.

Figure 10A:
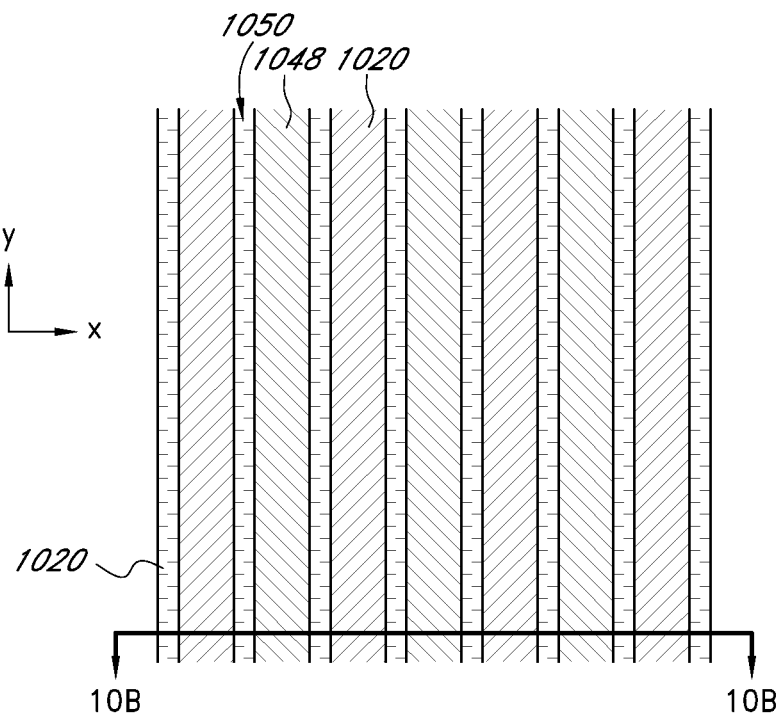
Figure 10B:
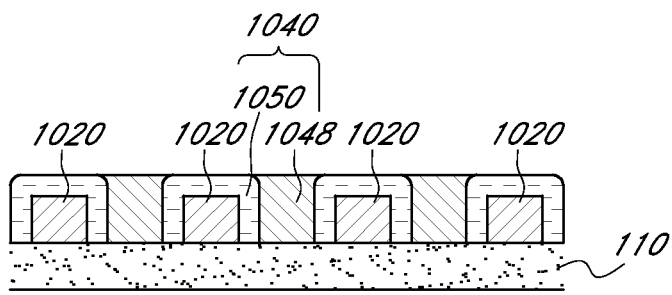
FIG. 10B is a cross-sectional view of FIG. 10A, taken along the line 10B-10B.

Subsequently, the structure shown in FIGS. 10A and 10B is subjected to a freeze step such that the top surface of the second resist layer 1040 is maintained during a subsequent step. The details of this freeze step can be as described above in connection with FIG. 3E.

Figure 11A:
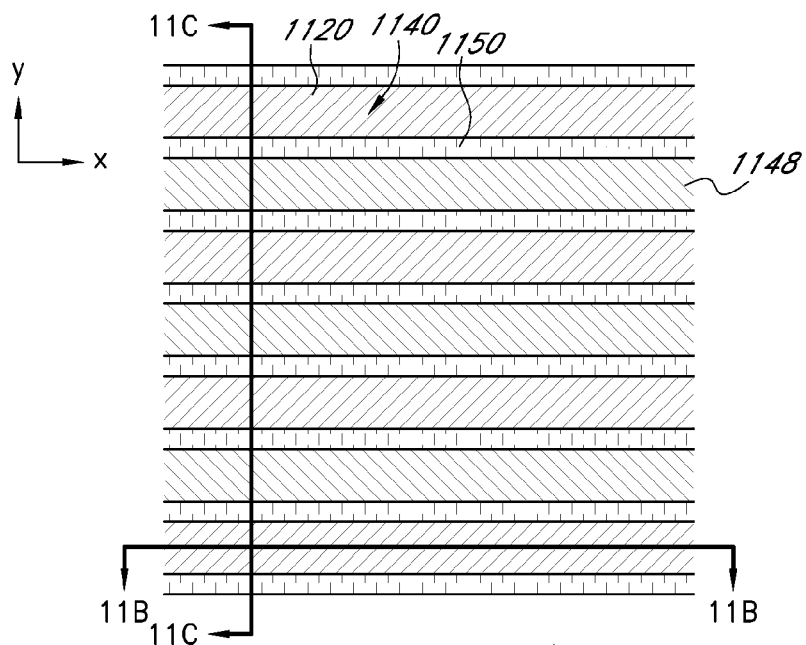
Figure 11B:
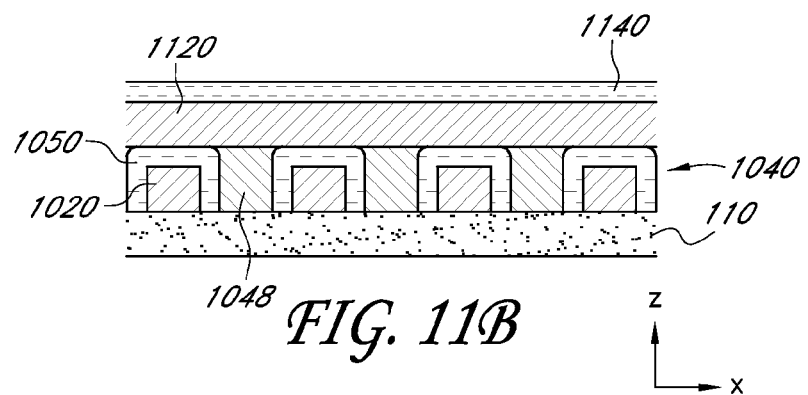
FIGS. 11B and 11C are cross-sectional views of FIG. 11A, taken along the lines 11B-11B and 11C-11C, respectively.
Figure 11C:
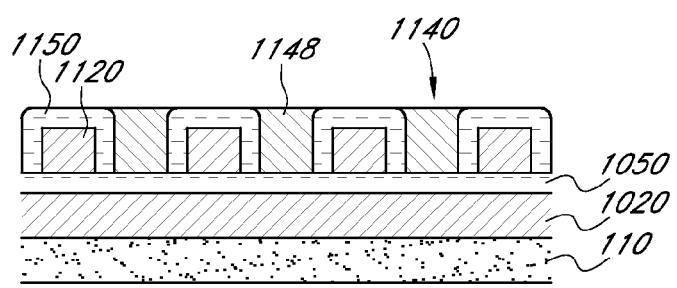

Referring to FIGS. 11A-11C, mandrels 1120 extending in the x-direction are formed by depositing and patterning a third resist layer on the second resist layer 1040 in the manner described above in connection with FIG. 3C. A fourth resist layer 1140 is formed over the mandrels 1120 and the second resist layer 1040. Second anti-spacers 1150 extending in the x-direction are formed around and on top of the mandrels 1120, thereby defining intervening mask features 1148 extending in the x-direction. The details of this process can be as described above in connection with FIGS. 3D-3G.

Figure 12A:
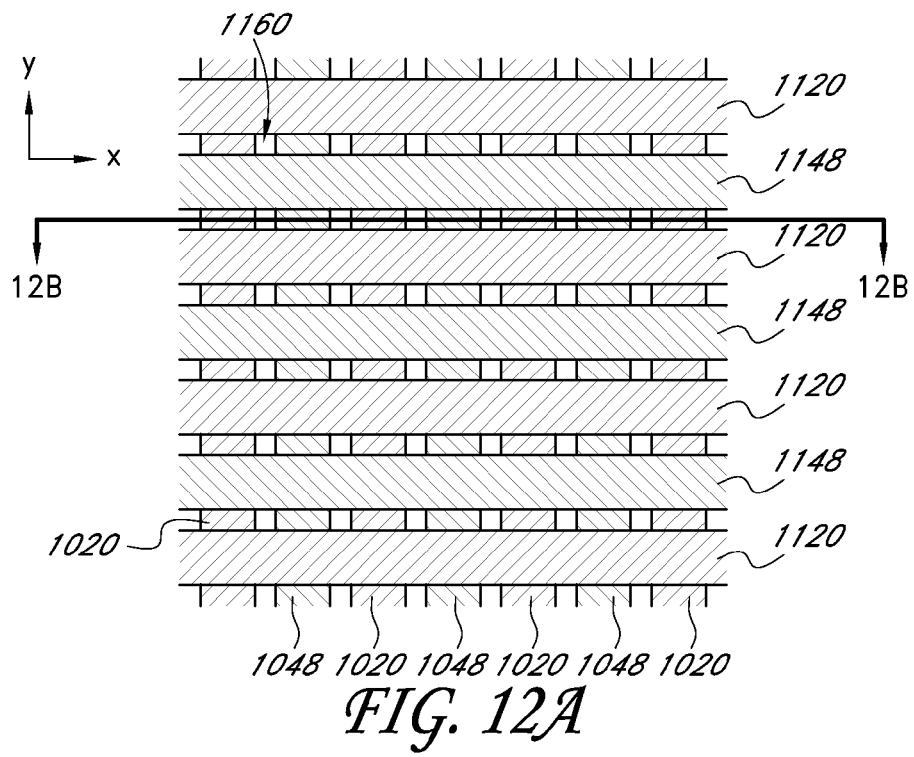
Figure 12B:
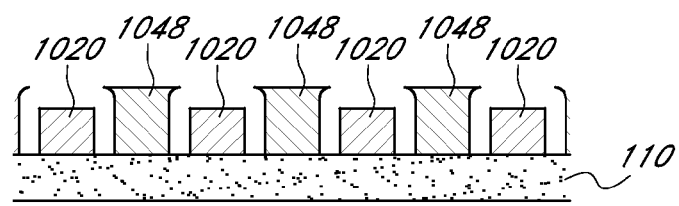
Figure 12C:
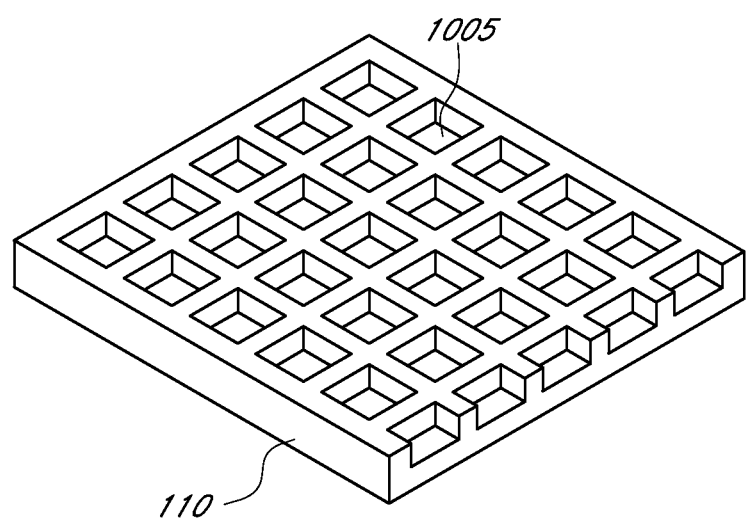
FIG. 12C is a schematic perspective view of a structure resulting from the process of FIGS. 10A-12B.
Figure 13A:
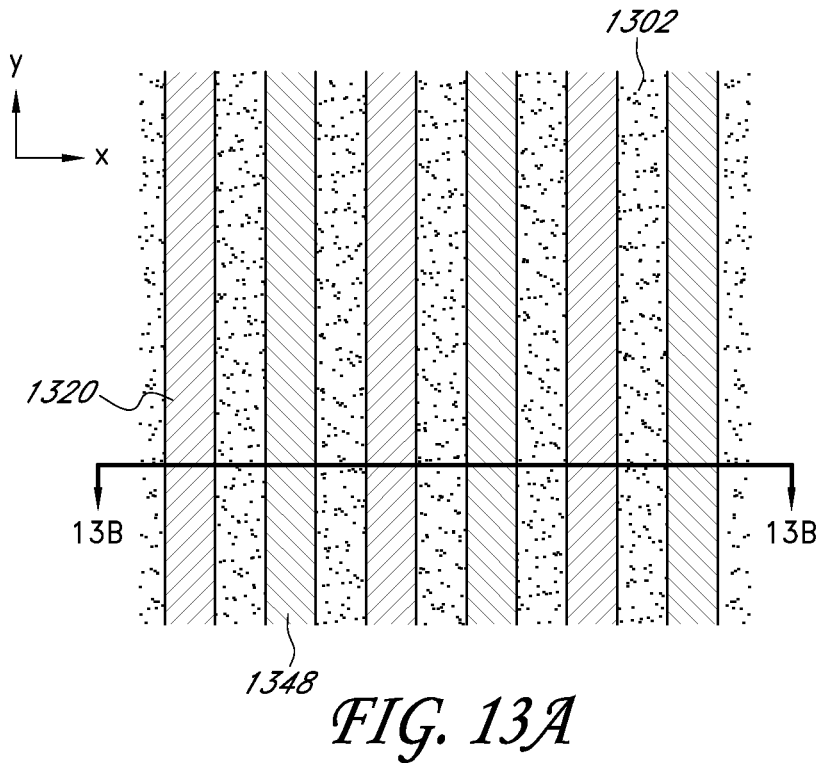
Figure 13B:
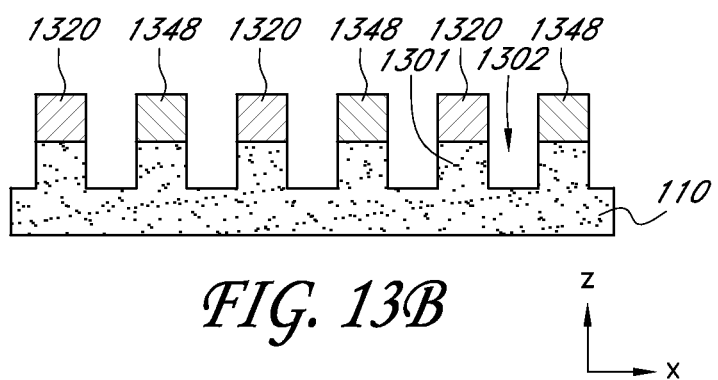
FIG. 13B is a cross-section of FIG. 13A, taken along the line 13B-13B.

Subsequently, the structure shown in FIGS. 11A-11C is subjected to development using a suitable developer. The developer removes the second anti-spacers 1150, thereby exposing parts of the first anti-spacers 1050 and the intervening mask features 1048. Then, the developer further removes the exposed parts of the first anti-spacers 1050, thereby creating an array of holes 1160 defined by the features 1020, 1048, 1120, 1148, as shown in FIGS. 12A and 12B. Then, a pattern formed by the array of holes 1160 is transferred into the target layer 110 in the manner described above in connection with FIG. 3K. The mask features 520, 548 are sequentially removed. A resulting structure of the target layer 110, which includes an array of isolated holes 1005, is shown in FIG. 12C.

In certain embodiments, the holes 1005 can be filled with a material (e.g., a dielectric material, a conductive material, or a semiconductor) such that structures formed in the holes 1005 can serve as posts or pillars in a resulting electronic circuit. In other embodiments, the method described above may be adapted for forming isolated holes, e.g., contact vias or trenches, depending on the design of the electronic circuit.

In other embodiments, the mandrels 1020 and the intervening mask features 1048 extending in the y-direction can be formed by any of the methods described above in connection with FIGS. 3A-3I, FIGS. 4A-4G, FIGS. 5A-5D, FIGS. 6A-6E, FIGS. 7A-7F, or FIGS. 8A-8E. Then, the mandrels 1120 and the intervening mask features 1148 extending in the x-direction can be formed over the mandrels 1020 and the intervening mask features 1048 by any of the methods described above in connection with FIGS. 3A-3I, FIGS. 4A-4G, FIGS. 5A-5D, FIGS. 6A-6E, FIGS. 7A-7F, or FIGS. 8A-8E. In some embodiments, a freeze step is required after forming the mandrels 1020 and the intervening mask features 1048 and before forming the mandrels 1120 and the intervening mask features 1148. In other embodiments, no freeze step is required after forming the mandrels 1020 and the intervening mask features 1048 and before forming the mandrels 1120 and the intervening mask features 1148.

FIGS. 13A-15B illustrate a method of forming an array of pillars or posts in a target layer using anti-spacers. In one embodiment, referring to FIGS. 13A and 13B, mandrels 1320 extending in the y-direction are formed by depositing and patterning a first resist layer on the target layer 110, as described above in connection with FIG. 3C. Intervening mask features 1348 extending in the y-direction and alternating with the mandrels 1320 are formed by forming and removing anti-spacers as described above in connection with FIGS. 3D-3I. Subsequently, a pattern defined by the mandrels 1320 and intervening mask features 1348 is transferred into the target layer 110 in the manner described above in connection with FIG. 3K. Exposed portions of the target layer 110 are etched, as shown in FIG. 13B, defining elongated trenches or troughs 1302 alternating with elongated mesas 1301 (unetched portions) in the target layer 110.

Figure 14A:
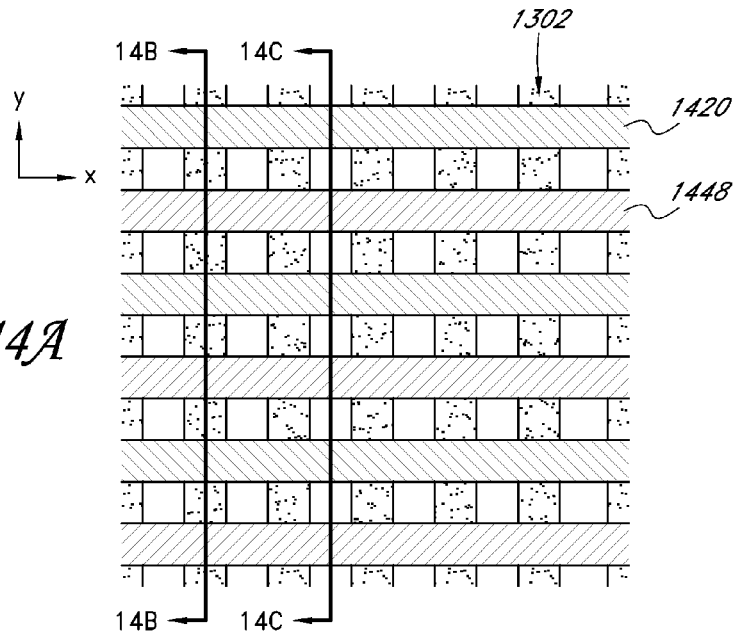
Figure 14B:
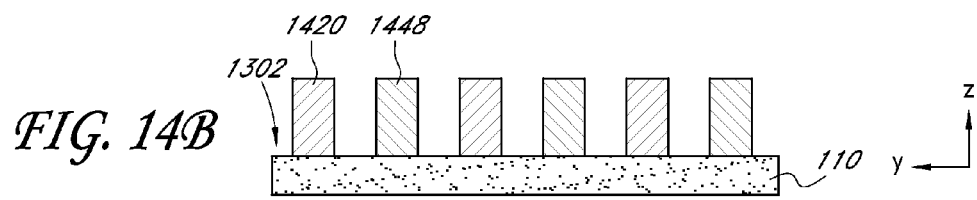
FIGS. 14B and 14C are cross-sectional views of FIG. 14A, taken along the lines 14B-14B and 14C-14C, respectively.
Figure 14C:
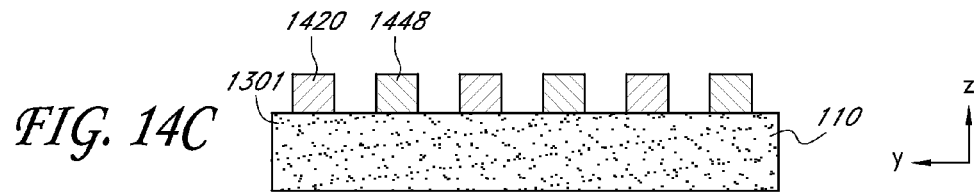
Figure 15A:
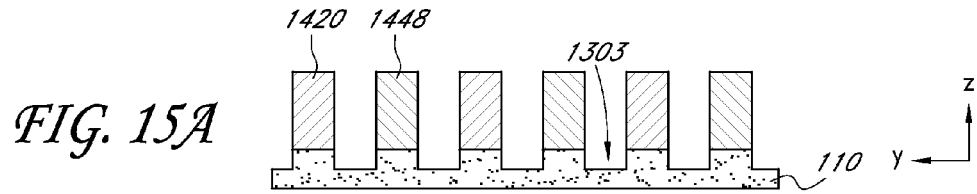
Figure 15B:
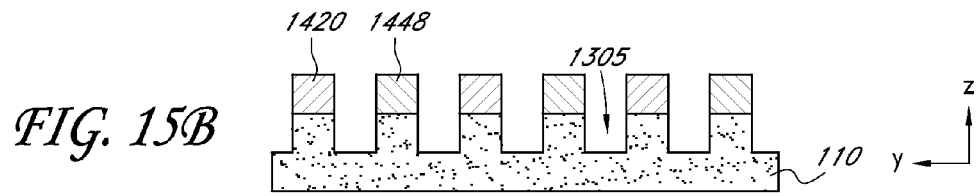
Figure 15C:
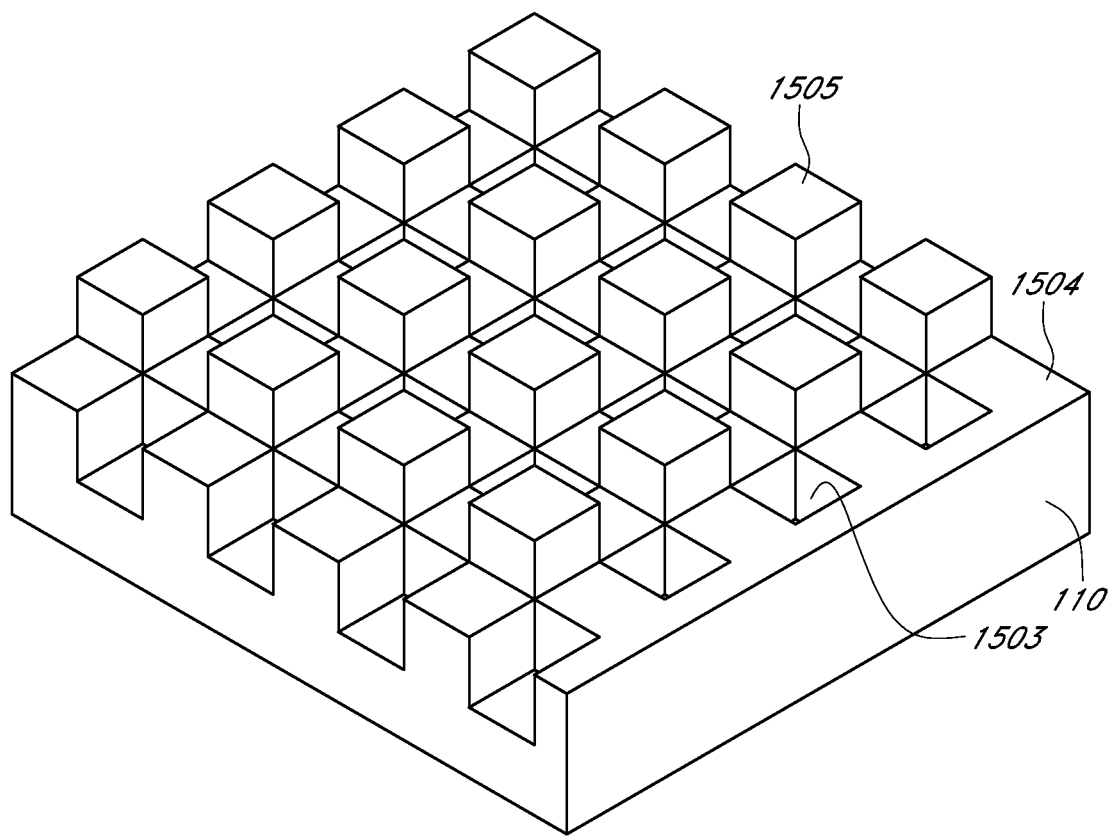
FIG. 15C is a schematic, perspective view of a structure resulting from the process of FIGS. 13A-15B.

Referring to FIGS. 14A-14C, mandrels 1420 extending in the x-direction are formed by depositing and patterning a third resist layer over the target layer 110 in the manner described above in connection with FIG. 3C. During this step, because the mandrels 1320 and the intervening mask features 1348 have not been subjected to a freeze step, the deposition of the third resist layer wipes the pattern formed by the mandrels 1320 and the intervening mask features 1348 (the deposited resist blends with the existing resist). Subsequently, intervening mask features 1448 extending in the x-direction and alternating with the mandrels 1420 are formed by forming and removing anti-spacers in the manner described above in connection with FIGS. 3D-3I. A pattern defined by the mandrels 1420 and the intervening mask features 1448 is transferred into the target layer 110, as shown in FIGS. 15A and 15B, in the manner described above in connection with FIG. 3K. Exposed portions of the elongated trenches or troughs 1302 of the target layer 110 are etched, as shown in FIG. 15A, defining isolated holes or vias 1303 in the target layer 110. Simultaneously, exposed portions of the mesas 1301 of the target layer 110 are etched, defining pillars or posts 1305, as shown in FIG. 15B. A resulting structure in the target layer 110, which includes an array of isolated pillars or posts 1305 and isolated holes 1303, is shown in FIG. 15C.

In other embodiments, the mandrels 1320 and the intervening mask features 1348 extending in the y-direction can be formed by any of the methods described above in connection with FIGS. 3A-3I, FIGS. 4A-4G, FIGS. 5A-5D, FIGS. 6A-6E, FIGS. 7A-7F, or FIGS. 8A-8E. Then, the mandrels 1420 and the intervening mask features 1448 extending in the x-direction can be formed over the mandrels 1320 and the intervening mask features 1348 by any of the methods described above in connection with FIGS. 3A-3I, FIGS. 4A-4G, FIGS. 5A-5D, FIGS. 6A-6E, FIGS. 7A-7F, or FIGS. 8A-8E.

Electronic devices, such as IC devices, typically include a plurality of conductive lines (for example, interconnects) and landing contact pads that electrically connect the conductive lines to other levels in the IC. The "landing contact pads" may also be referred to as "landing pads" or "contact tabs." The conductive lines typically have a width narrower than the widths of the landing pads. A conventional pitch multiplication process using spacers allows formation of conductive lines having a narrower line-width than that allowed by an available photolithographic process. However, because a masking pattern defined by such spacers can only provide features having such a narrow line-width, it can be difficult to form larger width landing pads using spacers.

In some embodiments, a process involving anti-spacers may be used to simultaneously form conductive lines and landing pads integrated with the conductive lines. Such a process can provide a single masking pattern for forming pitch-multiplied conductive lines as well as landing pads wider than the conductive lines.

Figure 16A:
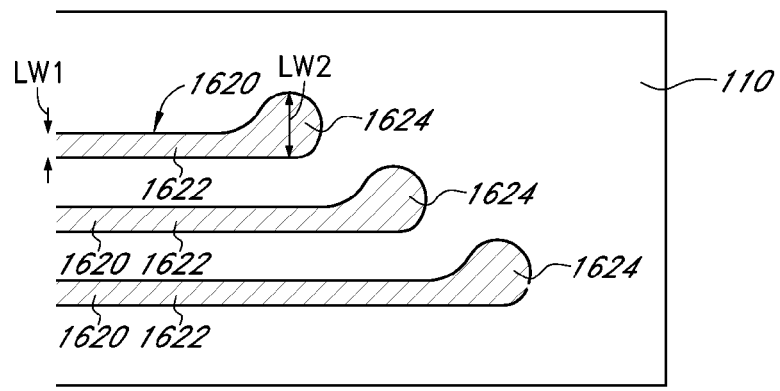
FIGS. 16A-16D are schematic, top plan views showing a process sequence for forming landing pads, in accordance with some embodiments.
Figure 16B:
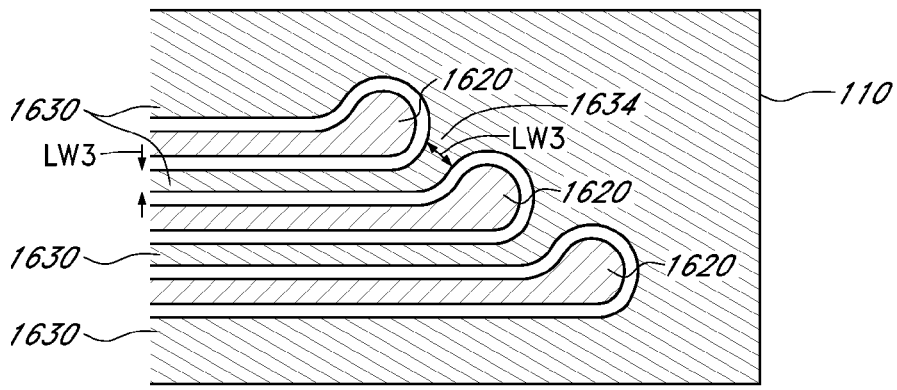
Figure 16C:
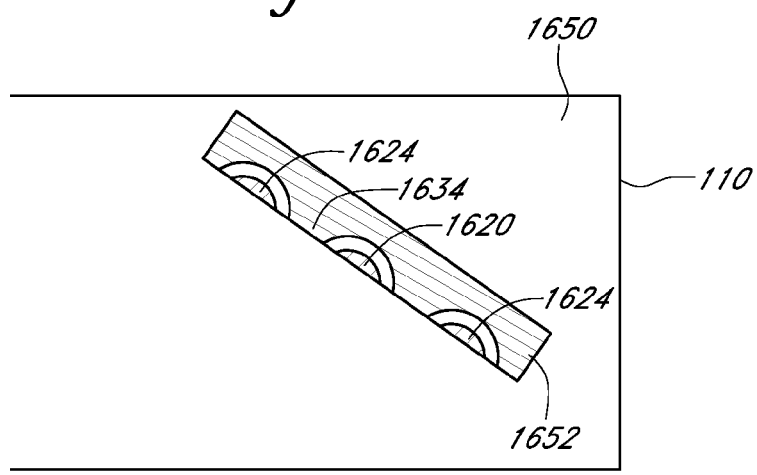

FIGS. 16A-16C illustrate a method of forming conductive lines and landing pads in an electronic device (for example, an IC circuit), using anti-spacers in accordance with some embodiments. Referring to FIG. 16A, mandrels 1620 are formed over a target layer 110 that is formed of a conductive material, such as copper, gold, silver, or an alloy thereof. Each of the mandrels 1620 may include a line mask feature 1622 that has a first width LW1, and a landing pad mask feature 1624 that has a second width LW2. The landing pad mask feature 1624 is connected to one end of the line mask feature 1622.

In the illustrated embodiment, the line mask features 1622 of the mandrels 1620 extend parallel to one another. In other embodiments, the configurations of the line mask features 1622 of the mandrels 1620 can vary, depending on the design of the electronic device formed by the method. The second width LW2 can be selected, depending on the size of a landing pad to be formed in the target layer 110, and is greater than the first width LW1.

In one embodiment, the second width LW2 is about 0.5 to about 5 times greater than the first width LW1. The illustrated landing pad mask feature 1624 has a substantially circular shape, but the skilled artisan will appreciate the landing pad mask feature 1624 can have various other shapes such as a square shape, a rectangular shape, an oval shape, or the like, depending on the desired shape of the landing pad. The mandrels 1620 can be formed as described above in connection with FIGS. 3A-3C.

Referring to FIG. 16B, intervening mask features 1630 are formed between two neighboring ones of the mandrels 1620 by forming and removing anti-spacers (not shown). Each of the intervening mask features 1630 may include a line mask feature 1632 that has a third width LW3, and a landing pad mask feature 1634 that has a fourth width LW4. The line mask features 1632 of the intervening mask features 1630 extend parallel to one another and to the line mask features 1622 of the mandrels 1620. In the illustrated embodiment, the third width LW3 is substantially the same as the first width LW1, and the fourth width LW4 is substantially the same as the second width LW2. In other embodiments, the third width LW3 can be different from the first width LW1, and/or the fourth width LW4 can be different from the second width LW2. The intervening mask features 1630 can be formed as described above in connection with FIGS. 3D-3I.

In other embodiments, the mandrels 1620 and the intervening mask features 1630 can be formed by any of the methods described above in connection with FIGS. 4A-4G, FIGS. 5A-5D, FIGS. 6A-6E, FIGS. 7A-7F, or FIGS. 8A-8E.

Referring to FIG. 16C, a cut mask 1650 is provided over the structure of FIG. 16B. The cut mask 1650 includes an opening 1652 that exposes parts of the landing pad mask features 1634 of the intervening mask features 1630 (and optionally end parts of the landing pad mask features 1624 of the mandrels 1620) while blocking the other portions of the features 1620, 1630. The opening 1652 is shaped such that the landing pad mask features 1634 of the intervening mask features 1630 are electrically separated from one another by a subsequent etch process. The exposed parts of the landing pad mask features 1624, 1634 of the features 1620, 1630 are removed by any suitable etch process that can remove the materials of the landing pad mask features selectively relative to the target layer 110.

Figure 16D:
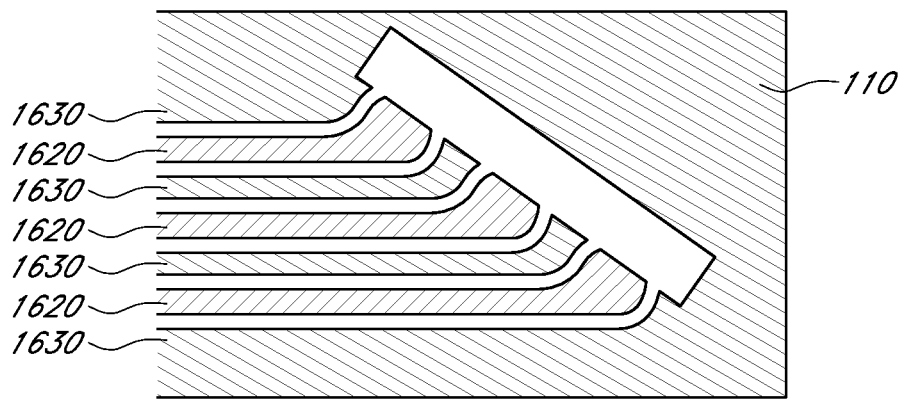

The mask 1650 is removed and the resulting features 1620, 1630 after the etch process are shown in FIG. 16D. A pattern defined by the mandrels and intervening mask features 1620, 1630 is transferred into the target layer 110 in the manner described above in connection with FIG. 3K.

In another embodiment, a pattern formed by the features 1620, 1630 shown in FIG. 16B is first transferred into the target layer 110, and then landing pads are defined by another etch step so as to be electrically isolated from one another. The skilled artisan will appreciate that various modifications can be made to the methods described above, depending on the design of the electronic device.

In the embodiments described above, the landing pads can be formed simultaneously with conductive lines, thus eliminating separate steps for defining and connecting the landing pads to conductive lines. Yet, the pitch of the conductive lines can be reduced at least to the same extent as in a conventional pitch multiplication process using spacers. While the embodiments above were described in connection with forming conductive lines and landing pads, the skilled artisan will appreciate that the embodiments can be adapted for forming various other structures or parts of electronic devices where different shapes or sizes of features are formed simultaneously.

In some embodiments, electronic devices, such as arrays in IC's, can be made by the methods described above. The electronic devices may also include a system including a microprocessor and/or a memory device, each of which includes features arranged in an array. Such a system may be a computer system, an electronic system, or an electromechanical system.

Examples of electronic devices include, but are not limited to, consumer electronic products, electronic circuits, electronic circuit components, parts of the consumer electronic products, electronic test equipments, etc. The consumer electronic products may include, but are not limited to, a mobile phone, a telephone, a television, a computer monitor, a computer, a hand-held computer, a personal digital assistant (PDA), a microwave, a refrigerator, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic device may include unfinished intermediate products.

Thus, it will be understood that the invention can take the form of various embodiments, some of which are discussed above and below.

In one embodiment, a method of forming features in an electronic device includes forming mandrels defining a first pattern in a first masking layer on one or more underlying layers comprising a target layer. The first pattern includes spaces between the mandrels, and has a first pitch. The method also includes depositing a second masking layer to at least partly fill the spaces of the first pattern. The second masking layer contacts the one or more underlying layers through the spaces between the mandrels. The method further includes forming sacrificial structures to define gaps between at least parts of the mandrels and at least parts of the second masking layer; and after depositing the second masking layer and forming the sacrificial structures, removing the sacrificial structures to define a second pattern having a second pitch smaller than the first pitch. The second pattern includes the at least parts of the mandrels and intervening mask features alternating with the at least parts of the mandrels.

In another embodiment, a method of forming features in an electronic device includes photolithographically forming mandrels defining a first pattern in a first masking layer over a target layer. The first pattern includes spaces between the mandrels, and has a first pitch. The method also includes depositing a second masking layer to at least partially fill the spaces of the first pattern; forming sacrificial structures to define gaps between at least parts of the mandrels and at least parts of the second masking layer; and after depositing the second masking layer and forming the sacrificial structures, removing the sacrificial structures to define a second pattern having a second pitch smaller than the first pitch. The second pattern includes the at least parts of the mandrels and intervening mask features alternating with the at least parts of the mandrels.

In yet another embodiment, a method of forming an integrated circuit includes forming a first pattern comprising first lines extending substantially parallel to one another in a first direction over a target layer. Forming the first pattern includes: providing first mandrels in a first masking layer over the target layer, the first mandrels having spaces therebetween; depositing a second masking layer to at least partially fill the spaces between the first mandrels; and forming first sacrificial structures to define gaps between at least parts of the first mandrels and at least parts of the second masking layer. The method also includes forming a second pattern comprising second lines extending substantially parallel to one another in a second direction over the first pattern, the second direction being different from the first direction. Forming the second pattern includes: providing second mandrels in a third masking layer over the second masking layer, the second mandrels having spaces therebetween; depositing a fourth masking layer to at least partially fill the spaces between the second mandrels; and forming second sacrificial structures to define gaps between at least parts of the second mandrels and at least parts of the fourth masking layer. The method further includes: removing the first sacrificial structures; removing the second sacrificial structures; and etching the target layer through the first pattern, the second pattern, or a combination of the first and second patterns.

Although this invention has been described in terms of certain preferred embodiments, other embodiments that are apparent to those of ordinary skill in the art, including embodiments that do not provide all of the features and advantages set forth herein, are also within the scope of this invention. Accordingly, the scope of the present invention is defined only by reference to the appended claims.

What is claimed is:

1. A method for integrated circuit fabrication, the method comprising:
    forming mandrels comprising mandrel material over a substrate, the mandrels separated by spaces;
    depositing a filler material into the spaces;
    forming sacrificial structures along an interface between the mandrels and the filler material;
    removing the sacrificial structures to define a mask comprising open spaces delineated by mask features formed of the mandrel material and the filler material, wherein portions of the mask features at least partially block openings to the open spaces;
    subjecting the mask features to an etch to remove the portions of the mask features at least partially blocking the openings; and
    subsequently transferring a pattern derived from the mask features to the substrate.

2. The method of claim 1, wherein forming the sacrificial structures comprises chemically altering portions of one or both of the mandrels and the filler material along the interface, wherein the chemically altered portions constitute the sacrificial structures.

3. The method of claim 2, wherein chemically altering the portions comprises diffusing a chemically active species into the portions.

4. The method of claim 3, further comprising depositing the chemically active species on the mandrels before depositing the filler material.

5. The method of claim 1, wherein forming sacrificial structures is accomplished by diffusing the chemically active species into the mandrels before depositing the filler material.

6. The method of claim 2, wherein the filler material comprises a photoresist, wherein chemically altering portions comprises diffusing chemically active species from the photoresist to the mandrels.

7. The method of claim 6, wherein the filler material comprises an acid-based or base-based chemically amplified resist.

8. The method of claim 1, wherein mask features formed by the mandrels and mask features formed by the filler material are at different heights after removing the sacrificial structures, further comprising:
    etching tops of the mask features formed by the filler material, thereby substantially equalizing the heights of the mask features formed by the mandrels and the mask features formed by the filler material.

9. The method of claim 1, further comprising:
    blanket depositing a layer of spacer material conformally over the mask features and the target layer;
    subjecting the layer of spacer material to a directional etch to form spacers at sides of the mask features;
    removing the mask features to leave free standing spacers, wherein the spacers define the pattern transferred to the substrate.

10. The method of claim 1, further comprising, after removing the sacrificial structures:
    depositing additional masking material into open spaces between the mask features;
    forming additional sacrificial structures at interfaces between the additional masking material and the mask features; and
    removing the additional sacrificial structures, wherein the mask features and a remainder of the additional masking material form an additional mask pattern.

11. The method of claim 1, further comprising, before subsequently transferring the pattern derived from the mask features to the substrate:
    depositing a protective material into the gaps and over the mask features;
    patterning the protective material to define additional mask features on a level above the mask features; and
    transferring a pattern defined by the additional mask features to a same level as the mask features.

12. The method of claim 11, wherein removing the sacrificial structures forms gaps, each gap defining a loop around each mandrel, and wherein:
    patterning the protective material exposes ends of the mandrels; and
    transferring the pattern defined by the additional mask features comprises etching at least portions of the exposed ends of the mandrels.

13. The method of claim 1, wherein subjecting the mask features to the etch comprises performing an isotropic etch.

14. A method for integrated circuit fabrication, the method comprising:
    forming a lower pattern of lines extending in a first direction, wherein forming the lower pattern comprises:
        forming lower mandrels comprising lower mandrel material over a substrate, the lower mandrels separated by spaces;
        depositing a lower filler material into the spaces;
        forming lower sacrificial structures along an interface between the lower mandrels and the lower filler material; and
        removing the lower sacrificial structures to define a lower mask comprising lower mask features formed of the lower mandrel material and the lower filler material; and
    forming an upper pattern of lines above the lower pattern lines and extending in a second direction crossing the first direction, wherein forming the upper pattern comprises:
        forming upper mandrels comprising upper mandrel material over the lower pattern of lines, the upper mandrels separated by spaces;
        depositing an upper filler material into the spaces;
        forming upper sacrificial structures along an interface between the upper mandrels and the upper filler material;
        removing the upper sacrificial structures to define an upper mask comprising open spaces delineated by upper mask features formed of the upper mandrel material and the upper filler material, wherein portions of the mask features at least partially block openings to the open spaces; and
        subjecting the upper mask features to an etch to remove the portions of the mask features at least partially blocking the opening; and aggregating the lower and upper patterns to form an aggregate pattern in a masking layer; and
transferring the aggregate pattern to the substrate.

15. The method of claim 14, further comprising subjecting the lower mask features to an etch to round top corners of the lower mask features.

16. The method of claim 15, wherein subjecting the upper mask features to the etch rounds top corners of the upper mask features.

\* \* \* \* \*